United States Patent
Lung et al.

(10) Patent No.: US 9,779,813 B2
(45) Date of Patent: Oct. 3, 2017

(54) PHASE CHANGE MEMORY ARRAY ARCHITECTURE ACHIEVING HIGH WRITE/READ SPEED

(71) Applicants: MACRONIX INTERNATIONAL CO., LTD., Hsinchu (TW); INTERNATIONAL BUSINESS MACHINES CORPORATION, Armonk, NY (US)

(72) Inventors: Hsiang-Lan Lung, Ardsley, NY (US); Hsin-Yi Ho, Hsinchu (TW); Scott C. Lewis, Essex Junction, VT (US); Richard C. Jordan, Hinesburg, VT (US)

(73) Assignees: MACRONIX INTERNATIONAL CO., LTD., Hsinchu (TW); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/222,861

(22) Filed: Jul. 28, 2016

(65) Prior Publication Data
US 2017/0076797 A1   Mar. 16, 2017

Related U.S. Application Data

(60) Provisional application No. 62/217,280, filed on Sep. 11, 2015.

(51) Int. Cl.
*G11C 8/16*    (2006.01)
*G11C 13/00*   (2006.01)

(52) U.S. Cl.
CPC ...... *G11C 13/0097* (2013.01); *G11C 13/0004* (2013.01); *G11C 13/004* (2013.01);
(Continued)

(58) Field of Classification Search
CPC ........... G11C 7/22; G11C 7/222; G11C 7/225; G11C 13/0004
(Continued)

(56) References Cited

U.S. PATENT DOCUMENTS 6,301,143 B1   10/2001   Fujita et al.
7,616,630 B2   11/2009   Ha et al.
(Continued)

OTHER PUBLICATIONS

Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, pp. 30.6.1,30.6.4.
(Continued)

*Primary Examiner* — Han Yang
(74) *Attorney, Agent, or Firm* — Haynes Beffel & Wolfeld LLP

(57) ABSTRACT

A memory configured to have data read therefrom is provided. The memory includes a data port including B transmitters disposed in parallel and for transferring data on both rising and falling edges of a clock, a first memory including a first data bus including N lines on which N bits can be transferred, and a second memory including a second data bus including N lines on which N bits can be transferred. The memory includes a data path controller including a data distributor disposed between the first and second memories and being connected to the data port, wherein, on the rising edge, the data distributor distributes a first data segment comprised of B bits from the first data bus to the data port and, on the falling edge, the data distributor distributes a second data segment comprised of B bits from the second data bus to the data port.

19 Claims, 14 Drawing Sheets

(52) U.S. Cl.
CPC ...... *G11C 13/0023* (2013.01); *G11C 13/0061* (2013.01); *G11C 13/0069* (2013.01)

(58) Field of Classification Search
USPC ........................................ 365/222, 148, 163
See application file for complete search history.

(56) References Cited

U.S. PATENT DOCUMENTS

| | | | |
|---|---|---|---|
| 8,149,643 B2* | 4/2012 | Tzou | G11C 8/12 365/230.03 |
| 2004/0117543 A1 | 6/2004 | Thomann et al. | |
| 2007/0150667 A1 | 6/2007 | Bains et al. | |
| 2009/0285040 A1 | 11/2009 | Fujimoto | |
| 2014/0101382 A1* | 4/2014 | Kaviani | G06F 12/0246 711/105 |

OTHER PUBLICATIONS

Choi et al., "A 20nm 1.8V 8Gb PRAM with 40MB/s program bandwidth," 2012 IEEE Int'l ISSCC Solid-State Circuits Conference Digest of Technical Papers, Feb. 19-23, 2012, pp. 46-48.
Chung et al., "A 58nm 1.8V 1Gb PRAM with 6.4MB/s program BW," 2011 IEEE ISSCC Int'l Solid-State Circuits Conference Digest of Technical Papers, Feb. 20-24, 2011, pp. 500-502.
Freitas, et al., "Storage-class memory: The next storage system technology," in IBM Journal of Research and Development, vol. 52, No. 4.5, pp. 439-447, Jul. 2008.
JEDEC Standard, DDR SDRAM Specification, JESD79C, Mar. 2003, 79 pages.

* cited by examiner

|  |  | Double Data Rate – 533 DRAM (4-4-4) | Double Data Rate PCM | Units |
|---|---|---|---|---|
|  | VDD | 1.8 ± 0.1 | 1.8 ± 0.1 | V |
|  | Frequency | 266 | 266 | MHZ |
|  | Data rate | 533 | 533 | MB/s |
|  | Burst Lenth | 4 or 8 | 16 | CLK |
| Read Performance | tRC:ACT to ACT Delay | 16 | 17 | CLK |
| | CL-tRCD-tRP | 12(4-4-4) | 11(10-1-0) | CLK |
| | RL | 7(AL=3,CL=4) | 10 | CLK |
| | Chip Read Throughput (Peak) | 533 | 533 | MB/s |
| | Read Bandwidth (Peak) | 4.3 | 4.3 | GB/s |
| Write Performance | tRC:ACT to ACT Delay | 20 | 47 | CLK |
| | tRCD-WL-tWR-tRP | 18(4-6-4-4) | 39(1-3-35-0) | CLK |
| | tWR | 4 | 35 | CLK |
| | Chip Write Throughput (Peak) | 533 | 533 | MB/s |
| | Write Bandwidth (Peak) | 4.3 | 4.3 | GB/s |

FIG. 7

| | Traditional Double Data Rate Array Partition | Array Partition of Double Data Rate PCM |
|---|---|---|
| Transient Noise | 128 bits of transient data in same location. | 64 bits of transient data in top/bottom bank. |
| Wire Congestion | Wire routing for 128 bits arranged from top to bottom of the partition. | Wire routing for 64 bits from top to center of the partition and for 64 bits from bottom to the center of the partition. |
| Longest Data Path | From top of the partition to bottom of the partition. | From top of partition to the center of the partition (same as from bottom of the partition to the center of the partition). |

FIG. 9

PHASE CHANGE MEMORY ARRAY ARCHITECTURE ACHIEVING HIGH WRITE/READ SPEED

RELATED APPLICATIONS

This application claims the benefit of U.S. Provisional Patent Application No. 62/217,280 filed on 11 Sep. 2015, which is incorporated by reference as if fully set forth herein.

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND

Technological Field

The present technology relates to a memory array architecture that can achieve a high read/write speed. The present technology can be applied to phase change memory (PCM) architectures, and can achieve this high read/write speed by utilizing a double-data-rate interface.

Description of Related Art

Storage class memory (SCM) has recently received increased attention due to its ability to improve performance and reduce power consumption of a computer system (Rich Freitas, et. al., "Storage Class Memory, the next storage system technology", in IBM J. RES. & DEV. VOL. 52 NO. 4/5, pp. 439-447, 2008). Generally, SCM is divided into different memory types based on random access speed. For example, SCM is divided into memory type (M-type) and storage type (S-Type). The performance of M-type SCM is close to DRAM. In contrast, the performance of S-type SCM is closer to that of a disk drive.

NAND type flash memory and three-dimensional (3D) NAND type flash memory have been widely used, or considered for use, as S-type SCM, but NAND and 3D NAND type flash memory technologies may not be able to meet recent performance and endurance requirements of M-type SCM (e.g., DRAM). However, DRAM is a volatile memory technology, making it desirable to provide a non-volatile technology that operates within the required performance specifications of M-type SCM. In view of the above, the following have emerged as possible candidates for M-type SCM applications: (i) phase change memory (PCM); (ii) resistive random-access memory (ReRAM) incorporating transition metal oxides; and (iii) spin transfer torque magnetic RAM (STTMRAM). Among these, PCM may be the most mature and promising non-volatile memory technology for M-type SCM applications.

In PCM, each memory cell includes a phase change material. The phase change material can change between a crystalline phase and an amorphous phase. The amorphous phase is characterized by higher electrical resistivity than the crystalline phase. During operation of the PCM, an electrical current pulse passed through a memory cell of the PCM can set and reset the solid phase in an active region of the phase change material (i.e., the electrical current pulse can be used to change the PCM between the higher resistivity amorphous phase and the lower resistivity crystalline phase).

The change from the amorphous phase to the crystalline phase, referred to herein as a SET operation, may be performed by applying an electrical pulse to the phase change material. The electrical pulse can include an initial peak current that is followed by decreasing current over a duration of the electrical pulse so that the phase change material slowly cools into the crystalline phase.

The change from the crystalline phase to the amorphous phase, referred to herein as the RESET operation, may be performed by applying a short and high current electrical pulse to the phase change material to melt or break down the crystalline phase structure of the phase change material. Afterwards the phase change material cools quickly (e.g., the phase change material is quenched). This quenching of the phase change material and allows at least a portion of the phase change material to stabilize in the amorphous phase.

As previously explained, in order to achieve similar performance of working memory of, for example, a computing device, a read/write bandwidth and latency of the M-type SCM needs to be as close to DRAM as possible. However, until recently PCM has not been a good candidate for M-type SCM because the phase changes are relatively slow, and PCM typically uses a lower performance non-volatile memory interface and array architectures. For example, around the year 2012 PCM had a read speed of approximately 400 MB/s and a write speed of approximately 40 MB/s (Youngdon Choi, et. al., "A 20 nm 1.8V 8 Gb PRAM with 40 MB/s Program Bandwidth", in ISSCC Dig. Tech. Papers, pp. 46-48, 2012; and Hoeju Chung, et al., "A 58 nm 1.8V 1 Gb PRAM with 6.4 MB/s Program BW", in ISSCC Dig. Tech. Papers, pp. 500-502, 2011), which is not sufficient for M-type SCM.

As discussed above, DRAM has typically been implemented in such situations (e.g., for M-type SCM applications). However, DRAM is a volatile memory technology. It is therefore desirable to provide a memory architecture for PCM and other non-volatile memory technologies that can support higher (e.g., double-data-rate) speeds.

SUMMARY OF THE INVENTION

A memory array architecture is described that supports a high throughput read/write scheme. Embodiments of the architecture described herein can reduce data transient noise, simplify wiring layouts, satisfy double-data-rate access characteristics, and reduce interference due to data line coupling, and reduce the timing differences between the shortest and the longest data paths. The technology described below can be implemented using phase change memory (PCM), and other types of programmable resistance memory (e.g., ReRAM, etc.). Also, the technology can be extended to other memory types.

A memory and a method of reading data from the memory, and a memory and a method of writing data to the memory are described herein.

In an embodiment, the memory includes a data port having a double-data-rate data channel including B transmitters disposed in parallel, where B is an integer of one or more, the B transmitters transferring data on both rising and falling edges of a transmit clock. Further, the memory includes a first memory array including a first array data bus including N lines on which N bits can be transferred in parallel, N being an integer of one or more, and a second memory array including a second array data bus including N lines on which N bits can be transferred in parallel. Additionally, the memory includes a data path controller including a timing circuit and a data distributor controlled by an output of the timing circuit, the data distributor being disposed in layout between the first memory array and the second memory array and being connected to the data port. A data distributor described herein can, on the rising edge of the transmit clock, distribute a first data segment comprised of B bits from the first array data bus to the data port for transfer, and on the falling edge of the transmit clock, distribute a second data segment comprised of B bits from the second array data bus to the data port for transfer.

In another embodiment, the method of reading data from a memory is provided. The memory includes a data port having a double-data-rate data channel including B transmitters disposed in parallel, where B is an integer of one or more, the B transmitters for transferring data on both rising and falling edges of a transmit clock, a first memory array including a first array data bus including N lines on which N bits can be transferred in parallel, N being an integer of one or more, a second memory array including a second array data bus including N lines on which N bits can be transferred in parallel, and a data path controller including a timing circuit and a data distributor controlled by an output of the timing circuit, the data distributor being disposed between the first memory array and the second memory array and being connected to the data port. Further, the method includes distributing, by the data distributor and on the rising edge of the transmit clock, a first data segment comprised of B bits from the first array data bus to the data port for transfer, and distributing, by the data distributor and on the falling edge of the transmit clock, a second data segment comprised of B bits from the second array data bus to the data port for transfer.

In another embodiment, the memory includes a data port having a double-data-rate data channel including B receivers disposed in parallel, where B is an integer of one or more, the B receivers transferring data on both rising and falling edges of a receiver clock. Further, the memory includes a first memory array including a first array data bus including N lines on which N bits can be transferred in parallel, N being an integer of one or more and a second memory array including a second array data bus including N lines on which N bits can be transferred in parallel. Additionally, the memory includes a data path controller including a timing circuit and a data distributor controlled by an output of the timing circuit, the data distributor being disposed between the first memory array and the second memory array and being connected to the data port, wherein, on the rising edge of the receiver clock, the data distributor distributes a first data segment comprised of B bits from the data port to the first array data bus for a data write, and wherein, on the falling edge of the receiver clock, the data distributor distributes a second data segment comprised of B bits from the data port to the second array data bus for a data write.

In another embodiment, the method of writing data from a data port to a memory is provided. The memory includes a data port having a double-data-rate data channel including B receivers disposed in parallel, where B is an integer of one or more, the B receivers for transferring data on both rising and falling edges of a receiver clock, a first memory array including a first array data bus including N lines on which N bits can be transferred in parallel, N being an integer of one or more, a second memory array including a second array data bus including N lines on which N bits can be transferred in parallel, and a data path controller including a timing circuit and a data distributor controlled by an output of the timing circuit, the data distributor being disposed between the first memory array and the second memory array and being connected to the data port. Further, the method includes and distributing, by the data distributor and on the rising edge of the receiver clock, a first data segment comprised of B bits from the data port to the first array data bus for a data write, and distributing, by the data distributor and on the falling edge of the receiver clock, a second data segment comprised of B bits from the data port to the second array data bus for a data write.

Other features, combinations of features, aspects and advantages of the technology described herein can be seen in the drawings, the detailed description and the claims, which follow.

BRIEF DESCRIPTION OF THE DRAWINGS

FIG. 7 illustrates a table that provides a performance comparison of traditional double-data-rate-533 DRAM to the double-data-rate PCM of the present disclosure.

FIG. 9 is a chart describing various advantages of the array partition of a double-data-rate PCM chip, as illustrated in FIGS. 5 and 8, over a traditional PCM array partition, according to an embodiment of the present disclosure.

DETAILED DESCRIPTION

A detailed description of embodiments of the technology is provided with reference to the FIGS. 1A-12.

Figure 1A:
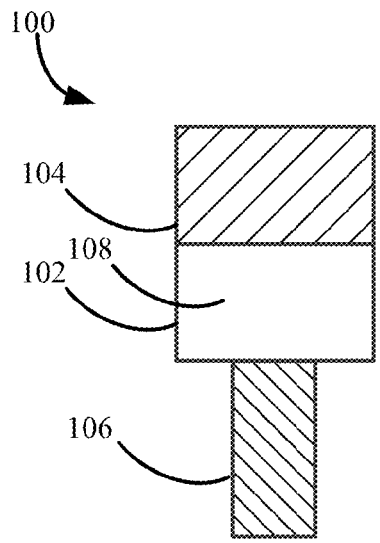
FIG. 1A illustrates a schematic of a portion of one type of a phase change memory (PCM) cell in a SET phase.
Figure 1B:
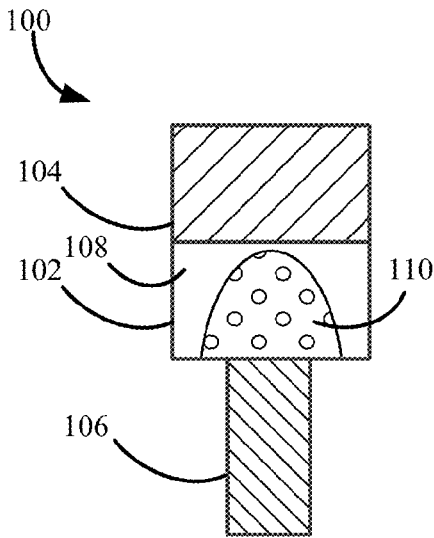
FIG. 1B illustrates a schematic of a portion of one type of a PCM cell in a RESET phase.

FIGS. 1A and 1B illustrate schematics of portions of one type of phase change memory (PCM) cell in a SET phase and a RESET phase, respectively, in accordance with an embodiment of the present disclosure.

Referring to FIGS. 1A and 1B, a memory cell portion 100 includes a memory element 102 located between a top electrode 104 and a bottom electrode 106. The memory element 102 includes a layer of phase change material. The phase change material may change between amorphous and crystalline phases in an active region of the memory element 102.

Embodiments of the memory cell include phase change based memory materials, including chalcogenide based materials (e.g., chalcogens) and other materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations of, for example, one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. Additionally, additives can be used to adjust characteristics of PCM memory cells, including dielectric doping, nitrogen doping, carbon doping, etc.

The memory cell portion 100 shown in FIG. 1A is in the SET phase where an active region of the phase change material of the memory element 102 is in the crystalline phase 108.

The memory cell portion 100 shown in FIG. 1B is in the RESET phase where the active region of the phase change material of the memory element 102 is in the amorphous phase 110. Since the active region is in the current path between the top electrode 104 and bottom electrode 106, resistance of the cell can change significantly between the SET and RESET states. A current applied through the top and bottom electrodes 104 and 106 of the memory cell portion 100 can cause heating of the memory element 102 which allows a change between the SET and RESET phases to occur.

Figure 1C:
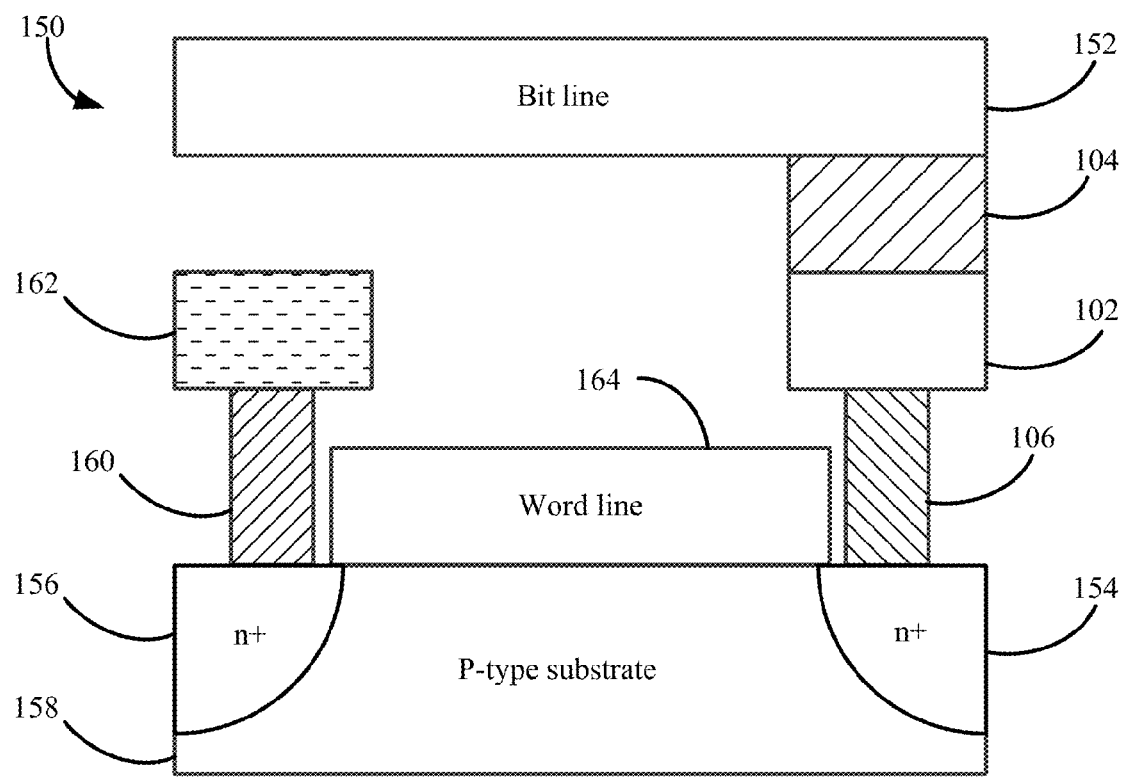
FIG. 1C illustrates a schematic of one type of a PCM cell including the portion illustrated in FIG. 1A, according to an embodiment of the present disclosure.

FIG. 1C illustrates a schematic of one type of a PCM cell including the portion illustrated in FIG. 1A, according to an embodiment of the present disclosure.

Referring to FIG. 1C, a PCM cell 150 includes the memory element 102 located between the top electrode 104 and the bottom electrode 106, as illustrated in FIG. 1A. As discussed above with reference to FIG. 1A, the memory element 102 includes a layer of phase change material. The phase change material may change between amorphous and crystalline phases.

The PCM cell 150 also includes an access device comprising a transistor in the illustrated example, having a channel in P-type substrate 158 having n+ source/drain contacts 154, 156, where n+ contact 154 is connected to the bottom electrode 106, and where the top electrode 104 is connected to a bit line 152 of the PCM cell 150. Further, n+ contact 156 is connected to interlayer connector 160, which is connected to a source line 162 which can be connected to ground, and a word line 164 of the PCM cell 150 overlies the channel of the access transistor. Other types of access devices can be used, including diodes, ovonic threshold switches and other switching devices.

Figure 2:
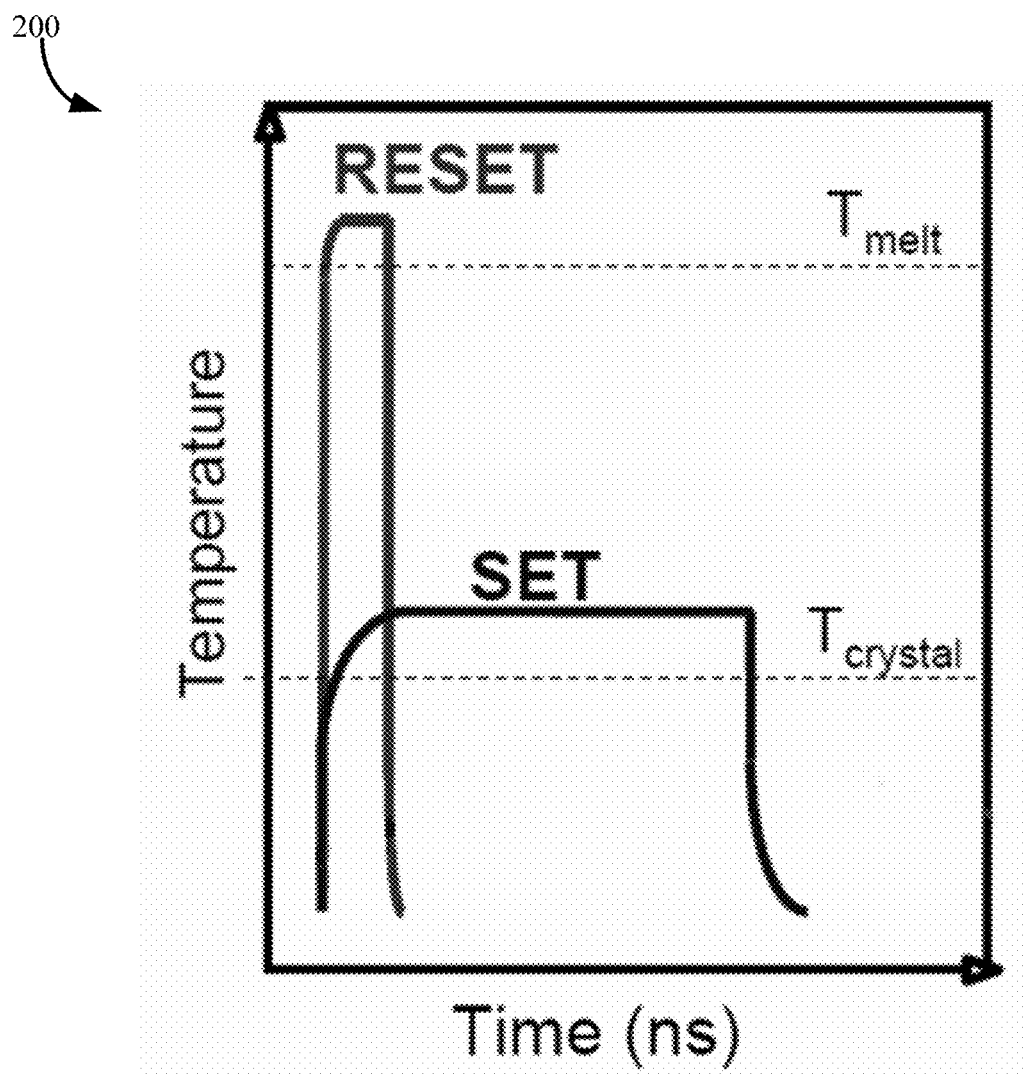
FIG. 2 is a chart illustrating a relationship between temperature and time for RESET and SET phases of a PCM cell.

FIG. 2 is a chart illustrating a relationship between temperature and time for the RESET, and SET phases of a PCM cell.

Referring to FIG. 2, a chart 200 illustrates that, in order to place the PCM cell in the RESET phase, the temperature must exceed a specific threshold $T_{melt}$ for a specific amount of time, typically measured in nanoseconds (ns). To place the PCM cell in the RESET phase, the temperature must be high enough to place the PCM cell in the amorphous phase, by, for example, changing the PCM cell from the crystalline phase to the amorphous phase. This can be achieved by applying a short high current pulse through the phase change material to melt or break down the crystalline phase structure in the phase change material. Afterwards the phase change material cools quickly, quenching the phase change process and allowing at least a portion of the phase change material to stabilize in the amorphous phase.

Further, the chart 200 illustrates that to place the PCM cell in the SET phase, the temperature of the PCM cell must exceed a specific threshold $T_{crystal}$ for a specific amount of time, yet remain below the temperature threshold $T_{melt}$. This temperature change may be performed by applying an electrical pulse through the phase change material. In one example of the electrical pulse used for a SET operation, an initial peak current is followed by decreasing current over the duration of the pulse so that the phase change material slowly cools into the crystalline phase.

Figure 3:
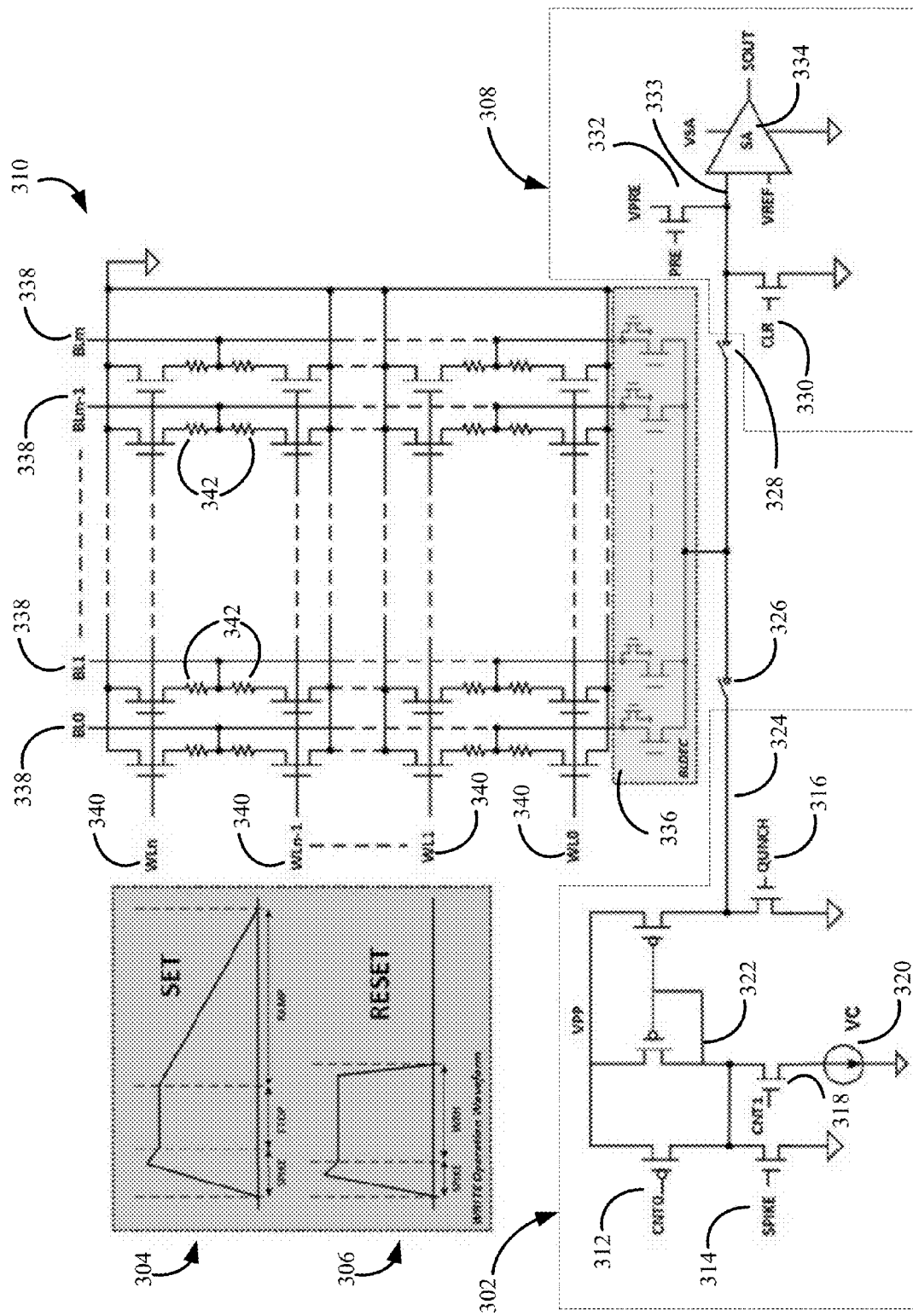
FIG. 3 illustrates an example part of an array of programmable resistance memory, such as PCM memory, and a write head (e.g., an adjustable writing circuity) and sense amplifier circuit, according to an embodiment of the present disclosure.

FIG. 3 illustrates an example part of an array of programmable resistance memory, such as PCM memory, and a write head (e.g., an adjustable writing circuity) and sense amplifier circuit.

Referring to FIG. 3, a circuit diagram 302 representing an adjustable writing circuit is illustrated. The adjustable writing circuit provides adjustable spike and current mirror functions so pulse shapes can be configured for the purposes of the chosen memory materials and cell structures. For example, when a spike function is turned on, a high current spike is provided to a selected memory cell of the PCM to begin the process of melting it. This melting process can be implemented to increase a set speed of high data retention PCM materials.

As illustrated, the adjustable writing circuit includes an initial control portion 312, a spike control portion 314 for controlling the spike function, a quench control portion 316, a write control portion 318, a variable current (VC) source portion 320, a drive node 322 and an output line 324 connected to a bitline decoder (BLDEC) 336.

As illustrated, a programming voltage (VPP) is supplied to the adjustable writing circuit. Using the VPP, each of the various portions 312, 314, 316, 318 and 320 is capable of controlling waveforms output from the output line 324 of the adjustable writing circuit.

With respect to the adjustable writing circuit, the initial control portion 312 receives a CNT0 signal that controls timing for an initial bias on the drive node 322.

During a SET operation, a SET waveform 304 is output on the output line 324. During a RESET operation, a RESET waveform 306 is output on the output line 324. The SET waveform 304 illustrates current vs. time for the SET operation, where the SET waveform 304 includes a SPIKE portion, a flat top (FTOP) portion and a RAMP portion.

The RESET waveform 306 illustrates current vs. time for the RESET operation, where the RESET waveform 306 includes a SPIKE portion, and a WRH (e.g., RESET) portion.

The adjustable writing circuit is capable of controlling at least one of an amplitude, a duration and a slope of one or more of the SPIKE portion, the FTOP portion, the RAMP portion and the WRH portion of the SET and RESET waveforms 304 and 306, as discussed below in further detail.

The spike control portion 314 receives a SPIKE signal that controls a timing of the a SPIKE portion of the SET and RESET waveforms 304 and 306 output from the output line 324 of the adjustable writing circuit to a PCM array 310 during both the SET operation and the RESET operation. By controlling the timing of the SPIKE portion of the SET waveform 304, it is possible to have the flexibility to melt the phase change material of the PCM before the FTOP portion of the SET waveform 304. These features and flexibility allow for increased performance and/or reliability of the PCM.

During the SPIKE portion of the SET waveform 304, the current can briefly rise above a reset minimum threshold (not illustrated), and then drop below the reset minimum threshold in order to sufficiently raise the temperature of the PCM to place the PCM in the crystalline phase.

During the SPIKE portion of the RESET waveform 306, the current can rise and be maintained above the reset minimum threshold. Unlike the SPIKE portion of the SET waveform 306, the current during the SPIKE portion of the RESET waveform 306 should not drop below the reset minimum threshold. This extended duration of the current being maintained above the reset minimum threshold in necessary in order to put the PCM in the amorphous phase.

Further, the write control portion 318 receives a CNT1 signal and the VC source portion 320 provides a VC to adjust the amount of the current and the duration of the FTOP portion of the SET waveform 304. During the FTOP portion, the SET waveform 304 should maintain a current below the reset minimum threshold and above a set minimum threshold (not illustrated).

Additionally, the write control portion 318 and the VC source portion 320 are configured to adjust a duration/slope of a ramp down during the RAMP portion of the SET waveform 304. During the RAMP portion of the SET waveform 304, the current is ramped down below the set minimum threshold. Specifically, the VC controls the current of the current mirror to define the length of the RAMP portion. The length of the RAMP portion is adjusted to fit set pulse requirements for different PCM materials. For example, a longer ramp is used for slower changing PCM materials, which often have better data retention.

Further, the write control portion 318 and the VC source portion 320 are configured to adjust a current and duration of the WRH portion of the RESET waveform 306 during the RESET operation.

Using a QUNCH signal, the quench control portion 316 is configured to adjust a timing of pulling down the current of the SET and/or RESET waveforms 304 and 306 output from the adjustable writing circuit. Specifically, the QUNCH signal controls a timing of the waveform, so that at an end, the current will quickly drop.

The SET and RESET waveforms 304 and 306 output on the output line 324 by the adjustable writing circuit are received by the bitline decoder 336 of the PCM array 310, as discussed in further detail below.

Additionally, as illustrated in FIG. 3, a circuit diagram 308 representing a reading circuit is provided. The reading circuit reads data stored on the PCM and includes a clear portion 330, a pre-charge portion 332 and a sense amplifier 334. The sense amplifier 334 receives data on a data line 333 from the bitline decoder 336 and provides an output (SOUT) based on the data received from the bitline decoder 336. The sense amplifier 334 is also configured, for example, to be connected to ground, a reference voltage (VREF), and a sense amplifier voltage (VSA).

The data line 333 of the sense amplifier 334 is also connected to the clear portion 330 which is used to ground the data line 333 of the sense amplifier 334. A clear control signal (CLR) is received by the clear portion 330 to control whether or not the data line 333 is grounded. The data line 333 of the sense amplifier 334 is also connected to the pre-charge portion 332 which provides a pre-charge voltage signal (VPRE) to the sense amplifier 334 as controlled by a pre-charge control signal (PRE). The pre-charge voltage is for pre-charging the data line 333.

Referring to FIG. 3, as discussed above, the PCM array 310 includes a bitline decoder 336 as well as various bitlines 338, word lines 340 and resistor symbols 342 representing programmable resistance memory elements such as PCM elements. For convenience, not all memory elements of the PCM array 310 are labeled, however each of the resistor symbols illustrated in the PCM array 310 represents a PCM element. As discussed above, the resistivity of the memory elements (i.e., the resistor symbols) 342 changes based on the waveform (e.g., the SET waveform 304 and the RESET waveform 306) output from the adjustable writing circuit). Specifically, the phase change material changes between the higher resistivity amorphous phase (e.g., a RESET operation) and the lower resistivity crystalline phase (e.g., a SET operation).

The bitline decoder 336 connects the data to the PCM memory by transmitting the waveforms 304 and 306 to the appropriate bitlines 338 to change the resistivity of the appropriate PCM elements (e.g., the resistor symbols 342). Further, data is read by the reading circuit based on the resistivity of the PCM elements, which is obtained from the bitline decoder 336.

Switches/gates 326 and 328 may be implemented to selectively connect the write circuit and the read circuit to the bitline decoder 336.

Figure 4:
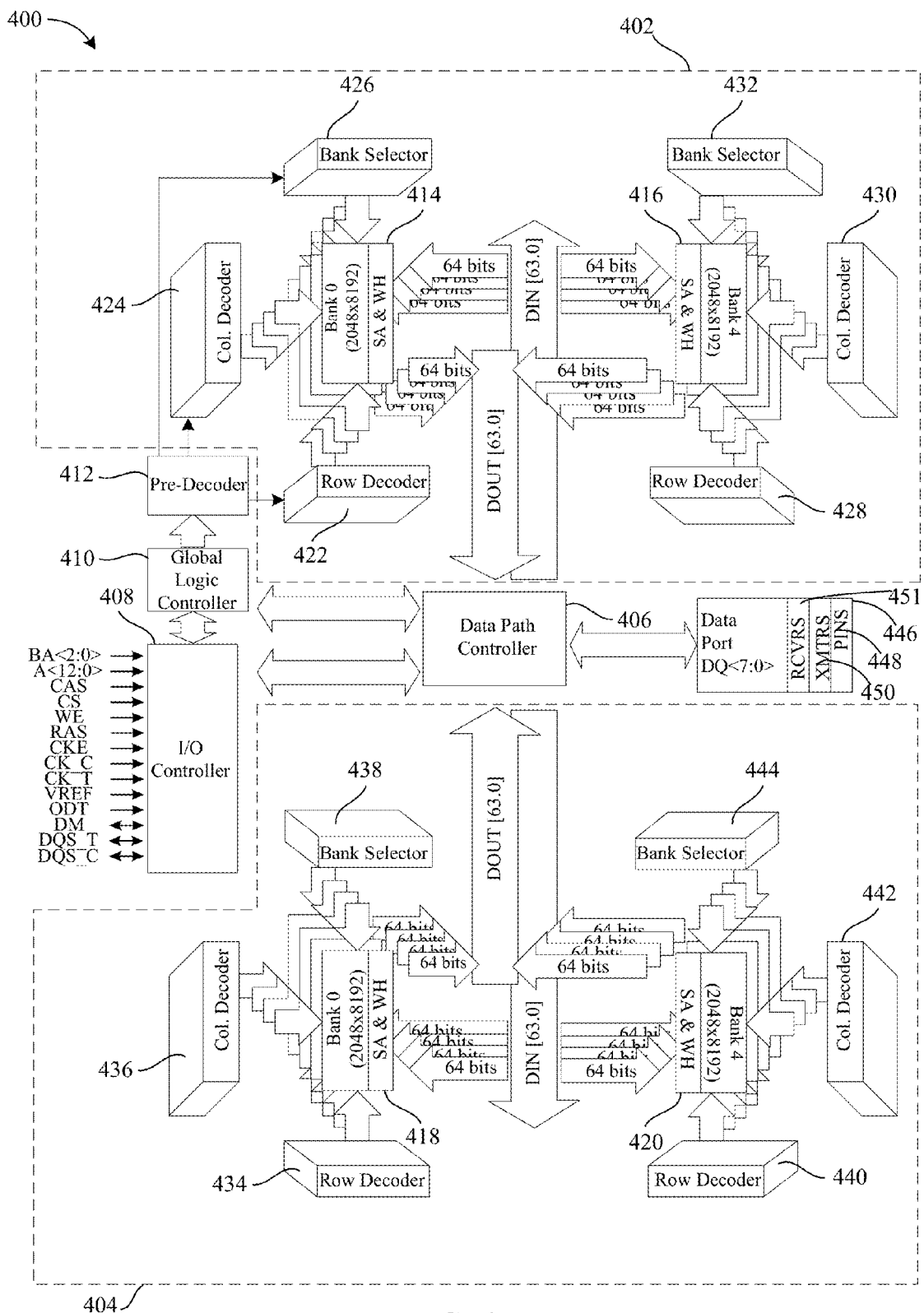
FIG. 4 illustrates an architecture and data paths of a double-data-rate PCM, according to an embodiment of the present disclosure.

FIG. 4 illustrates an architecture and data paths of a double-data-rate PCM, implemented on a single integrated circuit chip, according to an embodiment of the present disclosure. In other embodiments, the architecture can be implemented using a multiple-chip package or other combinations of more than one circuit components.

Referring to FIG. 4, a block diagram 400 is provided to illustrate the architecture and the data paths of a PCM having double-data-rate channels on data pins (to transmit/receive DQ<7:0>) of, for example, a data port 446. The data port includes a plurality of transmitters 450 and a plurality of receivers 451 by which data is transferred onto and off of the chip. The transmitters 450 can transfer data on both rising and falling edges of a transmit clock which can be, or can be derived from, external or internal clocks, including clock signals received or generated at an I/O Controller 408. The receivers 451 can transfer data on both rising and falling edges of a receiver clock which can be, or can be derived from, external or internal clocks, including clock signals received or generated at the I/O Controller. A double-datarate channel carries two bits of data for each clock cycle, such as by transmitting on both rising and falling edges of a clock signal. A double-data-rate channel can be enhanced to more than two bits per clock, such as four bits per clock, by transmitting on each 90 degree phase offset in the clock. A number of interface standards are known that utilize double-data-rate channels, some examples of which are commonly referred to as DDR, DDR2 or DDR3.

The block diagram 400 illustrates a top array half 402 and a bottom array half 404 of the double-data-rate PCM. The top array half 402 and the bottom array half 404 or referred to herein using the adjective, "half," due to the addressing scheme by which a block address is addressed to memory cells half of which are in the top array half 402 and half of which are in the bottom array half 404. The PCM also includes a data path controller 406, and I/O controller 408, a global logic controller 410, a pre-decoder 412, and a data port 446 including multiple transmitters 450 and multiple receivers 451 disposed in parallel and connected to input/output pads (pins) 448, which transmit/receive data on both rising and falling edges of a clock (e.g., a transmit clock or a receiver clock). Some or all of the input/output pads (pins) 448 are located in a layout of the PCM between the top array half 402 and the bottom array half 404. In an implementation, there may be multiple data ports 446 that send/receive data to/from the data path controller 406. The data ports 446 may be considered to be part of the I/O controller 408, but are illustrated as separate components in this drawing.

The block diagram 400 illustrates a total of 8 memory banks comprised of 16 half memory banks. Eight of the half memory banks are in the top array half 402 and eight of the half memory banks are in the bottom array half 404. Specifically, the top array half 402 includes a group of half banks 0-3 (i.e., 4 half banks) 414 and a group of half banks 4-7 (i.e., 4 half banks) 416 and the bottom array half 404 includes a group of half banks 0-3 (i.e., 4 half banks) 418 and a group of half banks 4-7 (i.e., 4 half banks) 420. Half bank 0 from the top array half 402 and half bank 0 from the bottom array half 404 form a complementary set of half banks. This complementary set of half banks, as later discussed in further detail, act (e.g., are treated from a memory address perspective) as a single memory bank that is read from and/or written to on rising and falling edges of a clock (e.g., a transmit clock) using the data path controller 406 and the data port 446. In a similar manner, half bank 1 from the top array half 402 and half bank 1 from the bottom array half 404 form another complementary set of half banks that act as a single memory bank. This also holds true for the remaining half banks 2-7 of the top array half 402 and the remaining half banks 2-7 of the bottom array half 404. These complementary sets of half banks comprise the 8 memory banks (comprised of the 16 half memory banks), as discussed above.

The group of half banks 414 is connected to a row decoder 422, a column decoder 424 and a bank selector 426, the group of half banks 416 is connected to a row decoder 428, a column decoder 430 and a bank selector 432, the group of half banks 418 is connected to a row decoder 434, a column decoder 436 and a bank selector 438 and the group of half banks 420 is connected to a row decoder 440, a column decoder 442 and a bank selector 444.

The pre-decoder 412 transmits information to each of the row decoders 422, 428, 434 and 440, the column decoders 424, 430, 436 and 442, and the bank selectors 426, 432, 438 and 444. While FIG. 4 only illustrates that the pre-decoder 412 is connected with the bank selector 426, the column decoder 424 and the row decoder 422, the pre-decoder 412 is also connected to bank selectors 432, 438 and 444, column decoders 430, 436 and 442 and row decoders 428, 434 and 440. Further, each of the row decoders 422, 428, 434 and 440 and each of the column decoders 424, 430, 436 and 442 receives (decoded) address data from the pre-decoder 412 for proper selection/identification of corresponding columns and rows of respective banks (or a page address to identify a page of, for example, 128 bits). Each of the bank selectors 426, 432, 438 and 444 receives decoded address data from the pre-decoder to identify the appropriate bank(s).

As illustrated, in an implementation, the groups of half banks 414 and 416 are connected to a 64-bit output data line (DOUT [63:0]) and a respective 64-bit input data line (DIN [63:0]), and the groups of half banks 418 and 420 are connected to a 64-bit output data line (DOUT [63:0]) and a respective 64-bit input data line (DIN [63:0]).

As discussed above, data comes in/out of the PCM via the input/output pads (pins) 448 in the data port 446, which includes, for example, 8 transmitters 450 and 8 receivers 451. The transmitters 450 transmit data on rising and falling edges of a transmit clock. The data path controller 406 in conjunction with the above described data port 446, top array half 402 and bottom array half 404 architecture controls the data flow, such that on the rising edge of the transmit or receiver clock, data from or destined to, for example, the top array half 402 is output or input, on lines DQ<7:0>, and on the falling edge of the transmit or receiver clock, data from or destined to, for example, the bottom array half 404 is output or input, on lines DQ<7:0>. As a result, data of the top array half 402 and the bottom array half 404 are interleaved on successive clock edges on the lines DQ<7:0>. In an implementation, the data is read from and/or written to the top array half 402 and the bottom array half 404 in parallel at a memory access rate based on one or more memory array clocks, and then the data is sent from and/or received by the data path controller 406 (to/from the data port 446) in a serial manner at a transmit clock rate based on one or more transmit clocks or at a receiver clock rate based on one or more receiver clocks.

Further, as discussed in detail below with respect to FIG. 5, the data comes in/out of the top array half 402 and the bottom array half 404 in such a manner that the data, which is interleaved between banks of the two halves 402 and 404, travels a relatively similar distance to reach the data path controller 406. This layout approach reduces an average length of data paths. This allows for lower latency operations with a large page size. Also, this layout spreads out locations of active data lines, with half on the top and half on the bottom for a given page. As a result, local coupling between the data lines is reduced, allowing for more efficient and less noisy data input and output.

The I/O controller 408 transmits and receives a variety of signals to support memory operations. For example, the variety of signal transmitted/received by the I/O controller 408 may include BA<2:0>, A<12:0>, CAS, CS, WE, RAS, CKE, CK_C, CK_T, VREF, ODT, DM, DQS_T, and DQS_C. Also signals DQ<7:0> (e.g., the signals transmitted/received on the pins DQ<7:0>) can be considered to be coupled to the I/O controller 408. Signal BA<2:0> is a bank select signal for defining to which bank a given command is applied, signal A<12:0> is a signal for identifying an address bus, signal CAS is a column address strobe signal, signal CS is chip select signal, signal WE is a write enable strobe signal, signal RAS is a row address strobe signal, signal CKE is a clock enable signal, signals CK_C and CK_T are complementary clock signals, signal VREF is a reference voltage, signal ODT is an on-die DQ termination signal, signal DM is a data mask signal, signals DQS_T and DQS_C are complementary data strobes, and signal DQ<7:0> is a data signal.

In response to the above-described signals, the I/O controller 408 sends/receives data to/from the data path controller 406, and also provides bank and address information to the global logic controller 410 to be sent to the pre-decoder 412 for bank, row and column address identification.

The above-described architecture of FIG. 4 may be implemented on a single chip and may be implemented in a multichip configuration, where the various components illustrated in FIG. 4 are spread out among multiple chips.

Figure 5:
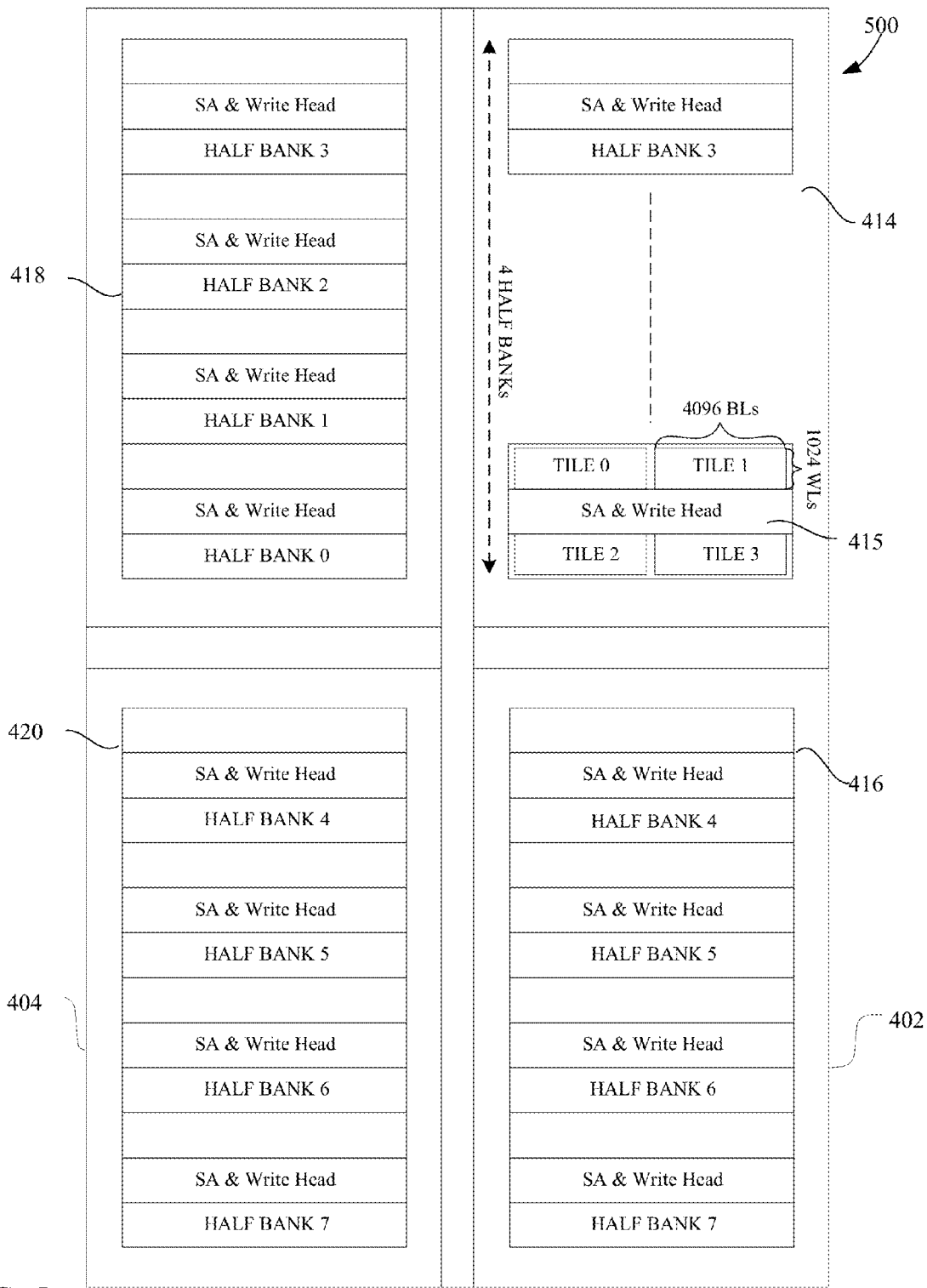
FIG. 5 illustrates an array partition of a double-data-rate PCM chip, according to an embodiment of the present disclosure.

FIG. 5 illustrates an array partition of a double-data-rate PCM chip, according to an embodiment of the present disclosure.

Referring to FIG. 5, an example of an array partition of a double-data-rate PCM chip 500 in a layout view, which in an implementation can include the groups of half banks 414, 416, 418 and 420 of FIG. 4, is illustrated. As discussed above, with reference to FIG. 4, the top array half 402 includes groups of half banks 414 and 416 and the bottom array half 404 includes groups of half banks 418 and 420. Further, the group of half banks 414 includes half banks 0-3, the group of half banks 416 includes half banks 4-7, the group of half banks 418 includes half banks 0-3 and the group of half banks 420 includes half banks 4-7. Also, as discussed above, various half banks form complementary sets, where a bank address (e.g., BA<2:0>, as illustrated in discussed above with reference to FIG. 4) selects one of eight half banks from the bottom groups (e.g. group 418 or group 420) and one of eight half banks from the top groups (e.g., group 414 or group 416). Further, for example, each of the half banks, such as for example half bank 0 of the group of half banks 414 includes four tiles (i.e., TILE 0, TILE 1, TILE 2 AND TILE 3) in this example, where each of the tiles contains 1024 word lines (WLs) and 4096 bit lines (BLs) for a total of 4 Mb.

In an implementation, when a word line is turned on in a tile of a half bank (e.g., half bank 2 in group 418) a corresponding word line is turned on in the corresponding tile in the complementary half bank (e.g., half bank 2 in group 414). Also, 64 bit lines and the sense amplifiers and/or write heads are activated in each half bank, for a total of 128 bit lines and the sense amplifiers and/or write heads of groups 414 and 418 being activated at the same time. This results in a 128-bit page being provided to a data distributor, with 64 bits from the top array half 402 and 64 bits from the bottom array half 404. As illustrated in group 414 of FIG. 5, the sense amplifiers and write heads 415 for each half bank are located in a layout in the center of each half bank, between a pair of tiles including tiles 0 and 1 on the top and a pair of tiles including tiles 2 and 3 on the bottom. This layout improves the uniformity of RC delays, reducing the distribution in delays from each accessed cell in a given page. In an implementation, there are 1024 total sense amplifiers and 1024 write heads on the double-data-rate PCM chip 500, where each group of half banks 414, 416, 418 and 420 includes 256 (64×4) sense amplifiers and 265 write heads. A column decoder on each tile is configured to connect one bit line from each of 32 groups of 128 bit lines to one of 64 lines on an input or output bus for the half bank. Each of the 32 groups in each tile can be configured as shown in FIG. 3.

Further, in an implementation, during a read/write operation, 128 bits (e.g., 64 bits from half bank 3 of the group of half banks 414 and 64 bits from half bank 3 of the group of half banks 418) are read/written via 8 data pads (DQ<7:0> in 8 clock cycles, i.e., 16 clock edges).

Figure 6A:
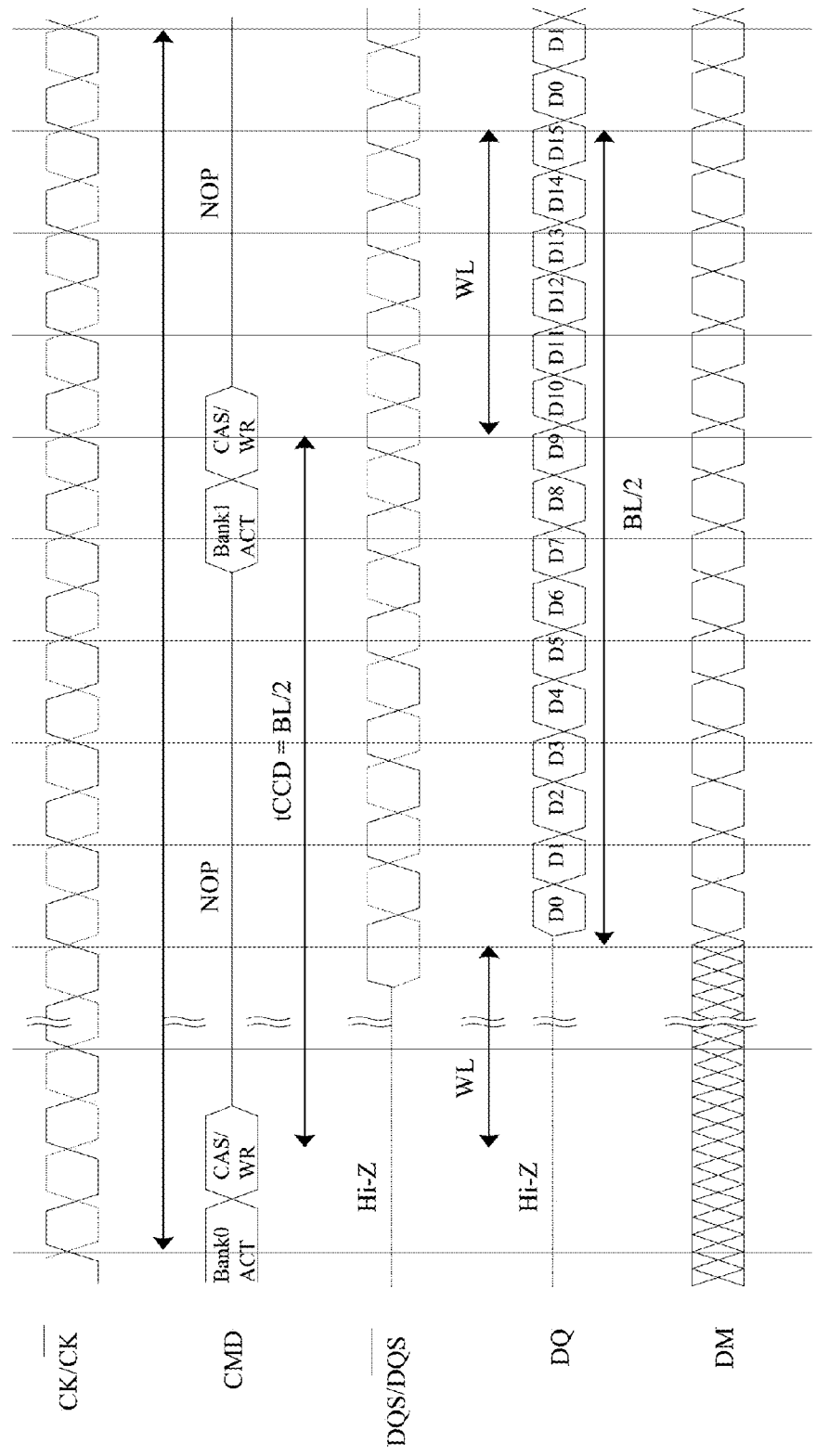
FIGS. 6A and 6B illustrate, for a double-data-rate PCM, timing charts for a seamless burst write operation and a seamless burst read operation, according to various embodiments of the present disclosure.
Figure 6B:
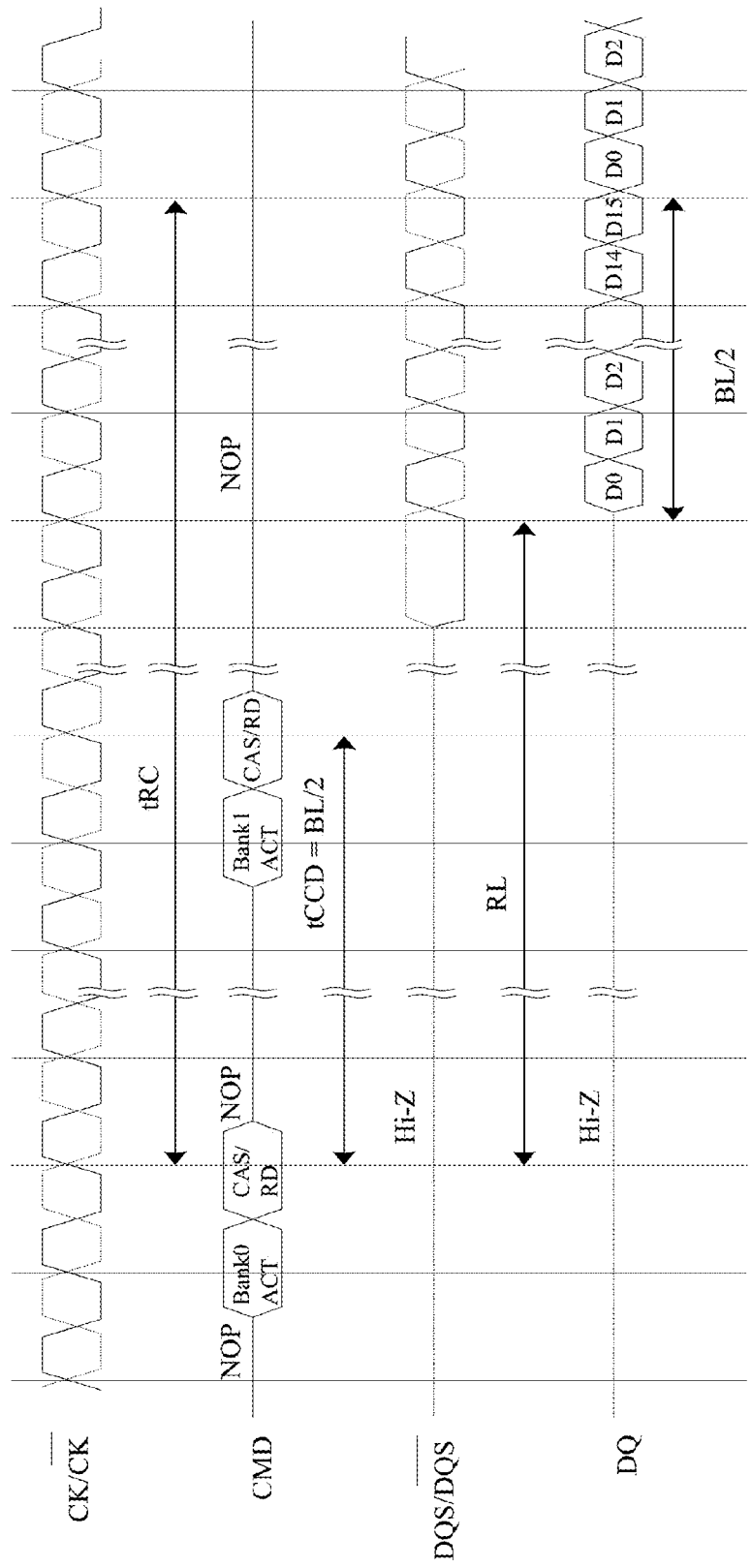
Figure 6C:
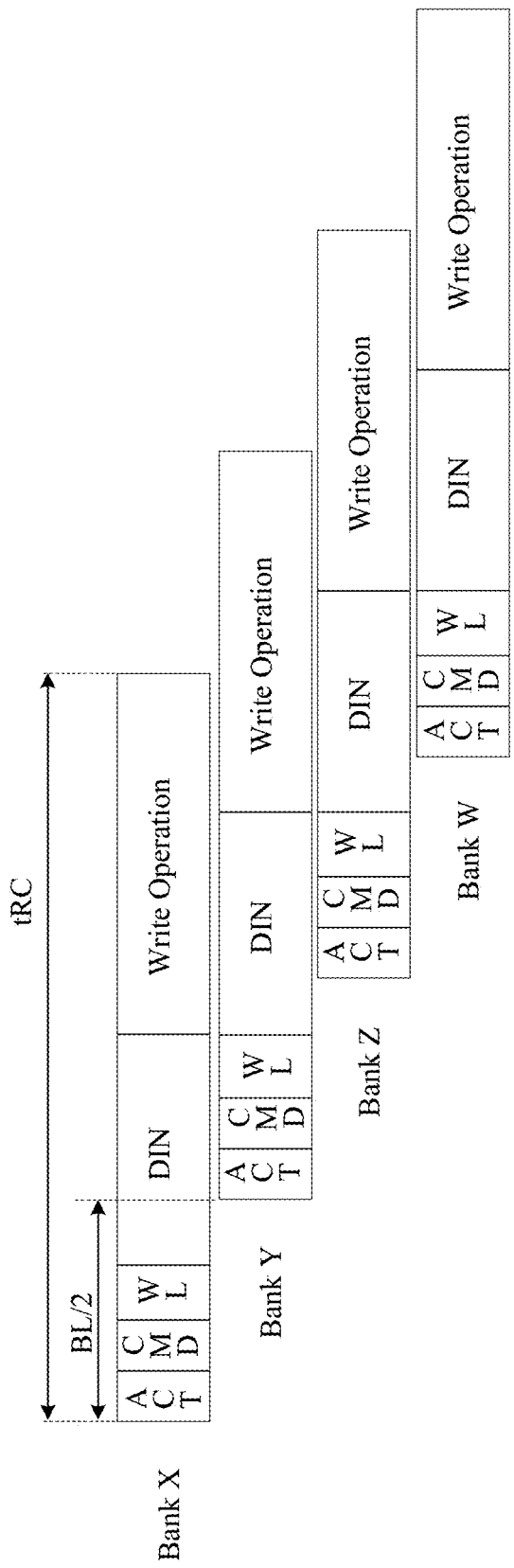
FIG. 6C illustrates timing blocks related to a write operation, according to an embodiment of the present disclosure.

FIGS. 6A and 6B illustrate, for a double-data-rate PCM, timing charts for a seamless burst write operation and a seamless burst read operation, and FIG. 6C illustrates timing blocks related to a write operation, according to various embodiments of the present disclosure.

Referring to FIGS. 6A and 6B, timing charts for a seamless write operation and a seamless read operation are respectively illustrated. In a seamless write operation, as illustrated in FIG. 6A, a first write directed to one bank can overlap with a second write directed to a different bank, so that data input for the two banks can be delivered seamlessly (without idle clock cycles) on data input lines. In a seamless read operation, as illustrated in FIG. 6B, a first read directed to one bank can overlap with a second read directed to a different bank, so that the data output from the two banks can be delivered seamlessly on data output lines. These overlaps allow the read and write operations to be performed so that only one read latency (RL) or write latency (WL) will be seen when data is read or written to/from different banks.

Referring to FIGS. 6A and 6B, timing signals are shown for a clock (CK), an alternative (inversed) clock ($\overline{CK}$), a command (CMD), a data strobe (DQS), an alternative (inversed) data strobe ($\overline{DQS}$), and a data (DQ) read/write. Further, FIG. 6A illustrates a data mask (DM) timing signal that is enabled to mask out corresponding data input The CMD signal is for controlling a Bank 0 activation (ACT), a Bank 1 ACT, a column address strobe (CAS) and a read (RD) and/or write (WR). Between the ACT and CAS, the CMD provides a no operation (NOP) signal. The DQ signal is for reading/writing data, where 128 bits of data are read/written during 8 clock cycles, 8 bits on each of the rising edges of the clock and 8 bits on each of the falling edges of the clock.

Specifically, referring to FIG. 6A, when a write operation starts, a first bank is activated (Bank0 ACT) followed by the CAS/WR command to turn on 128 bit lines and write heads in the same bank (64 in each half bank). After a write latency (WL) from the CMD, and initiation of the DQS, write data begins to be clocked two bits per cycle into the PCM through 8 I/O pins (only one DQ pin shown). Using the 8 I/O pins, for each rising and falling clock edge, 8 bits are written into the array for each rising and falling clock edge. Therefore, after 1 cycle (e.g., 1 clock) 16 bits are written into the double-data-rate PCM and after 8 clocks (e.g. 16 clock edges D0 to D15) 128 total bits are written into the first bank (e.g., 16 bits per clock and 8 clocks equals 128 bits).

After 4 clocks of writing data to the first bank (i.e., without waiting for the first bank to finish writing) a second memory bank is activated (Bank1 ACT) followed by the CAS/WR command to turn on 128 bit lines and write heads in the same bank (64 in each half bank), so as to write another set of 128 bits into the double-data-rate PCM. By using this approach, data is seamlessly written into the remainder of the banks with a full speed data rate without interruption.

If the data set being transferred is large enough, 4 clocks after an 8th (last) bank has been activated, the first bank can be activated again to form a seamless writing loop within those 8 banks until the CPU stops writing. A major benefit of this structure is that it is possible to relax a need for having a very fast set speed for the PCM by continually writing data into different banks without waiting for first bank to finish. For example, for a double-data-rate PCM, a 150 ns set speed is sufficient for 8 banks to seamlessly write with a 533 MB/s data rate.

Additionally, as illustrated in FIG. 6A, WL is the delay between the CAS/WR and the first write, and a number of clocks between the CAS/WR for Bank0 and the CAS/WR for Bank1 is tCCD (also referred to as CAS to CAS delay), which is also equal to a burst length (BL) divided by 2. In this example, the tCCD is 8 clocks, since the BL is 16. Additionally, as illustrated, prior to providing a signal, the DQS and DQ set to a high impedance (Hi-Z).

Referring to FIG. 6B, the seamless read operation uses a similar procedure as that described above with respect to the seamless write operation, except that the write head is turned off and the sense amplifier is activated to output data (e.g., after the activation of a bank, a CAS/RD command turns on 128 bit lines and sense amplifiers). Furthermore, referring to FIG. 6B, a read cycle time (tRC) is a minimum number of clock cycles a page read command takes to complete, and a read latency (RL) is the delay between the CAS/RD and a first data read.

The blocks of FIG. 6C illustrate the timing of a write operation for writing data to 4 different banks (i.e., bank X, bank Y, bank Z and bank W). As illustrated, bank X is activated (ACT) by pre-charging in order to prepare bank X to be written to and commands (CMD) are received to turn on bit lines and write heads of the bank. The WL is needed to provide sufficient time for the activation to complete before the data is written (e.g., received on DQ lines). After the WL, data input (DIN) is received for the write operation on bank X. In an implementation, the DIN is received and stored on a buffer. After the DIN is finished on bank X the write operation for bank X begins.

While the DIN is still being received for bank X and after a number of clock cycles equaling BL/2, bank Y is activated (ACT) and bank Y receives commands (CMD), etc., in the same manner as bank X. During the write operation of bank X and after the ACT, CMD and WL of bank Y, the DIN is received for bank Y for the write operation on bank Y. Next, after the timing for the DIN finishes on bank Y, the write operation is performed on bank Y, such that the data writing operation on bank Y begins before the data writing on bank X is finished. This process allows for seamless writing while transitioning from writing to bank X to writing to bank Y. In other words, because the timing of the DIN for bank X ends at the time that the DIN timing for bank Y starts, the write operations for banks X and Y is seamless. This above-described procedure continues through to bank Z and bank W and, if necessary, returns back to bank X, etc., until data writing is complete.

FIG. 7 illustrates a table that provides a performance comparison of traditional double-data-rate-533 DRAM to the double-data-rate PCM of the present disclosure.

Referring to FIG. 7, a performance comparison for random read/write operations of a double-data-rate DRAM and a double-data-rate PCM is provided.

Before describing the table of FIG. 7, which provides the performance information for random read/write operations, it is noted that one of the differences between random read/write operations and the seamless read/write operations, as discussed above with reference to FIGS. 6A and 6B, is that for random read/write operations there is a delay in clock cycles that elapse after a final (random) write operation and before a memory bank can be activated using the ACT signal. This delay is described in the table as tWR, which can also be called as a write recovery time. The tWR delay is not present during the seamless read/write operations of FIGS. 6A and 6B.

Referring to the table of FIG. 7, notable differences in performance between the double-data-rate-533 DRAM and the double-data-rate PCM are that the burst length (BL) of the double-data-rate-533 is either 4 or 8 clocks and the BL of the double-data-rate PCM is 16 clocks. Additionally, although the double-data-rate PCM has a longer CL (number of clocks between a controller telling a memory to access a particular column in a current row and data from that column being read) compared to the double-data-rate-533 (i.e., 10 clocks compared to 6), the double-data-rate PCM has a much shorter tRCD (number of clocks between an ACT command and a read/write command) compared to the DDR-533 (1 clock compared to 4) and also has a much shorter tRP (number of clocks between a row pre-charge command and an ACT command) compared to the double-data-rate-533 (0 clocks compared to 4). As a result, the total clocks required by the CL, tRCD and tRP of the double-data-rate PCM is 11 clocks compared to 12 clocks required by the double-data-rate-533.

Moreover, referring to the table of FIG. 7, the double-data-rate-533 has a RL of 7 clocks and the double-data-rate PCM has a RL of 10 clocks, and the tRC of the double-data-rate-PCM is 47 clocks compared to 20 clocks for the double-data-rate-533. However, the read and write peak throughputs are the same for both the double-data-rate-533 and the double-data-rate PCM, as are the read and write peak bandwidths.

Further, although the double-data-rate PCM has a very short WL (i.e., 3 clocks) one concern is that the random write performance to the same bank is limited by the tWR, which is 35 clocks. When data is continually written to the same bank, a first set of 128 bits needs to finish writing before a second address comes available to write another 128 bits. For example, considering a phase change material with a 120 ns set speed, the tWR needs at least 35 clock cycles. Adding a same bank writing buffer will reduce the impact of the tWR on the random writing performance. As such, an optimal solution is to utilize a material which can switch in 30 ns and get a good distribution.

As seen from the data included in the table, comparing the double-data-rate PCM to the double-data-rate DRAM, the double-data-rate PCM has the same VDD (1.8V), operation frequency (266 MHZ), and the read/write data rate (533 MB/s). A dual in-line memory module (DIMM) card with 8 double-data-rate PCM chips can provide a read and write bandwidth of 4.3 GB/s.

The RL of the double-data-rate-PCM is only 3 clock cycles (11.25 ns) slower than the double-data-rate-533 DRAM. Because the double-data-rate PCM has a longer burst length of 16 clocks, as opposed to the double-data-rate-533 DRAM, which has a burst length of 4 or 8 clocks, a tCCD (i.e., a CAS to CAS delay, also equal to BL/2), not illustrated, of both read and write operations on the double-data-rate PCM is 4 to 6 clock cycles slower than the double-data-rate-533 for a first page; the tCCD in following pages for seamless read and write operations is the same for both the double-data-rate-PCM and the double-data-rate-533 DRAM. As discussed above, the table of FIG. 7 illustrates the impact of the tWR on a same bank write performance and also illustrates that due to a 120 ns set time the tRC (ACT to ACT delay) during a first page write operation is 27 clock cycles longer on the double-data-rate PCM than on the double-data-rate-533 DRAM. For subsequent pages the tRC for read and write operations is the same for both the double-data-rate PCM and the double-data-rate-533 DRAM.

Figure 8:
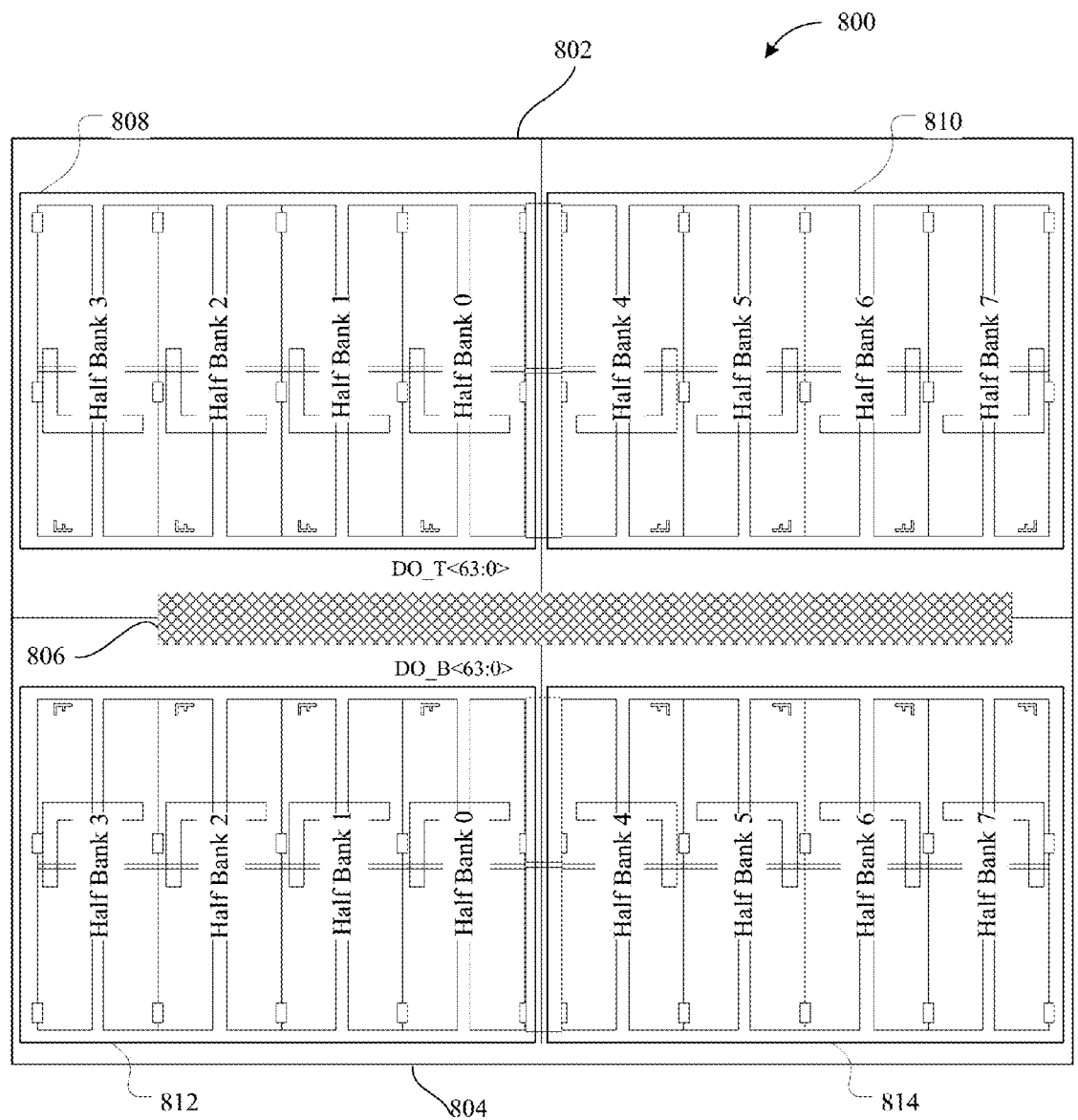
FIG. 8 illustrates an architecture of a PCM array partition according to an embodiment of the present disclosure.

FIG. 8 illustrates a layout architecture of a PCM array partition according to an embodiment of the present disclosure.

Before discussing the architecture of the PCM array partition of the present disclosure, it is noted that the traditional PCM array has several shortcomings, many of which are overcome by the present disclosure. Specifically, a traditional PCM array partition includes address pads located at a top of the partition and includes data pads located at a bottom of the partition. As discussed above, this architecture causes problems, in that there is a significant difference in a data path length between a top array and the data pads and a data path length between a bottom array and the data pads (e.g., the data path from the bottom array to the data pads is much shorter than the data path from the top array to the data pads). This difference in data path length can dramatically impact access performance based on the location of the data array being accessed. For example, using the traditional PCM array architecture, the access performance must provide sufficient time for the longest data path between the data pads and the various data arrays. This traditional structure also causes other problems, such as transient noise and wiring congestion.

Referring to FIG. 8, an architecture of a PCM array partition 800 is illustrated, where the PCM array partition 800 includes a top half 802 and a bottom half 804, and includes block 806 which includes, for example, address pads, data pads, a data path controller (e.g., the data path controller 406 of FIG. 4) and/or a data distributor (e.g., the data distributor 1010 of FIG. 10) located between the top and bottoms halves 802 and 804. As illustrated, top half 802 provides 64 bits on a data line (i.e., DO_T<63:0>) to the data pads 806 and bottom half 804 provides 64 bits on a data line (i.e., DO_B<63:0>) to the data pads 806.

The PCM array partition 800 includes a total of 8 memory banks (16 half memory banks). Specifically, in the same manner as discussed above with reference to FIG. 4, the top half 802 includes a group of half banks 0-3 (i.e., 4 half banks) 808 and a group of half banks 4-7 (i.e., 4 half banks) 810 and the bottom half 804 includes a group of half banks 0-3 (i.e., 4 half banks) 812 and a group of half banks 4-7 (i.e., 4 half banks) 814. Furthermore, as discussed with reference to FIG. 4, half bank 0 from the top half 802 and half bank 0 from the bottom half 804 form a first complementary set of banks, half bank 1 from the top half 802 and half bank 1 from the bottom half 804 form a second complementary set of banks, and so on.

This architecture allows data to be interleaved (divided) among the top and bottom halves 802 and 804, such that the banks written/read to/from the top and bottom halves 802 and 804 (half bank 0 from the top half 802 and half bank 0 from the bottom half 804) are a relatively equal distance from the data pads 806.

Accordingly, this PCM array partition 800 solves the above-mentioned problem regarding data path length as discussed above. Specifically, because the data pads 806 are located in the center of the PCM array partition 800 and because complementary half banks of the top/bottom halves 802 and 804 are respectively used on the rising/falling edges of the clock, a difference between a longest data path (e.g., a longest data path from the top half 802 and/or the bottom half 804 to the data pads 806) and a shortest data path (e.g., a shortest data path from the top half 802 and/or the bottom half 804 to the data pads 806) can be significantly reduced in comparison to the difference in data path lengths required by the traditional architecture, as discussed above. In other words, in an implementation, the difference in length between the longest data path and the shortest data path can be so small that a maximum length data path (e.g., the longest data path) and a minimum length data path (e.g., the shortest data path) are relatively similar in length.

Additionally, based on this structure a maximum length of a wire routing for a data path from a bank (e.g., an address memory cell of half bank 3) of the top half 802 (e.g., a first memory array) to the data pads 806 (or the data distributor 1010) and a maximum length of a wire routing for a data path from a bank (e.g., an address memory cell of half bank 3) of the bottom half 804 (e.g., a second memory array) to the data pads 806 (or the data distributor 1010 illustrated in FIG. 10) are substantially equal. Additionally, based on this structure, a minimum length of a wire routing for a data path from a bank (e.g., an address memory cell of half bank 0) of the top half 802 (e.g., a first memory array) to the data pads 806 (or the data distributor 1010) and a minimum length of a wire routing for a data path from a bank (e.g., an address memory cell of half bank 0) of the bottom half 804 (e.g., a second memory array) to the data pads 806 (or the data distributor 1010) are substantially equal. By "substantially equal" it is meant that the wire lengths are close enough in length that the double-data-rate timing can be conserved when accessing cells on the top and bottom in an interleaved fashion, without expanding the sampling intervals beyond the maximum allowed for the clock rates being utilized due to the differences in lengths.

This above-described architecture illustrated in FIG. 8 can also solve the above-mentioned problems by reducing transient noise as a result of sharing rising/falling data access from the top/bottom halves 802 and 804 and by reducing wiring congestion as a result of dividing data signals into half wiring from the top half 802 and the other half wiring from the bottom half 804. Again, in contrast to the above-discussed traditional architecture, by putting the data pads 806 in the center of the PCM array partition 800, and between of top and bottom halves 802 and 804, as illustrated in FIG. 8, the longest and shortest data path difference can be minimized.

As discussed above, the PCM array partition 800 is utilized in a double-data-rate PCM chip, such that data comes in/out at each clock's rising or falling edge. Accordingly, as described above, half bank 0 from the top half 802 and bottom half bank 0 from the bottom half 804 comprise a complementary set of banks, which are read/written from/to as a full bank, where, for example half bank 0 from the top half 802 is accessed on the rising edge of the clock and half bank 0 from the bottom half 804 is accessed on the falling edge of the clock. In other words, this architecture of the present disclosure requires rising edge data to come from (or to be sent to) the half banks from the top half 802 and falling edge data to come from (or to be sent to) the half banks from the bottom half 804 (or vice versa). This approach reduces average data path lengths and spreads out the location of active data lines reducing local coupling to make the data throughput much more efficient and less noisy.

FIG. 9 is a chart describing various advantages of the array partition of a double-data-rate PCM chip, as illustrated in FIGS. 5 and 8, over the traditional PCM array partition, as discussed above, according to an embodiment of the present disclosure.

Referring to FIG. 9, the chart describes that in a traditional double-data-rate array partition, 128 bits of data are transient in a same location, whereas in the double-data-rate PCM array partition, according to the present disclosure, only 64 bits of data are transient in the top half and only 64 bits of data are transient in the bottom half. By having only 64 bits of data transient in a portion (e.g., top or bottom), transient noise is reduced in this new array partition.

Further, referring to the chart of FIG. 9, the traditional double-data-rate array requires wire routing for 128 bits to be arranged from top to bottom of the same partition to be able to reach the data pads, whereas this architecture of the double-data-rate PCM merely requires wire routing for 64 bits from the top of the partition to the data pads located in the center and merely requires wire routing for 64 bits from the bottom of the partition to the data pads located in the center. This structure alleviates and reduces wire congestion.

Moreover, referring to the chart of FIG. 9, the traditional double-data-rate array requires the memory controller to control access to the double-data-rate array based on the longest data path, from the top of the array to the data pads located at the bottom of the array. In contrast, this architecture of the double-data-rate PCM merely requires the longest data path to be from the top of the array partition to the center of the array partition (or from the bottom of the array partition to the center of the array partition). This structure greatly reduces the longest data path that must be compensated for by the controller.

Figure 10:
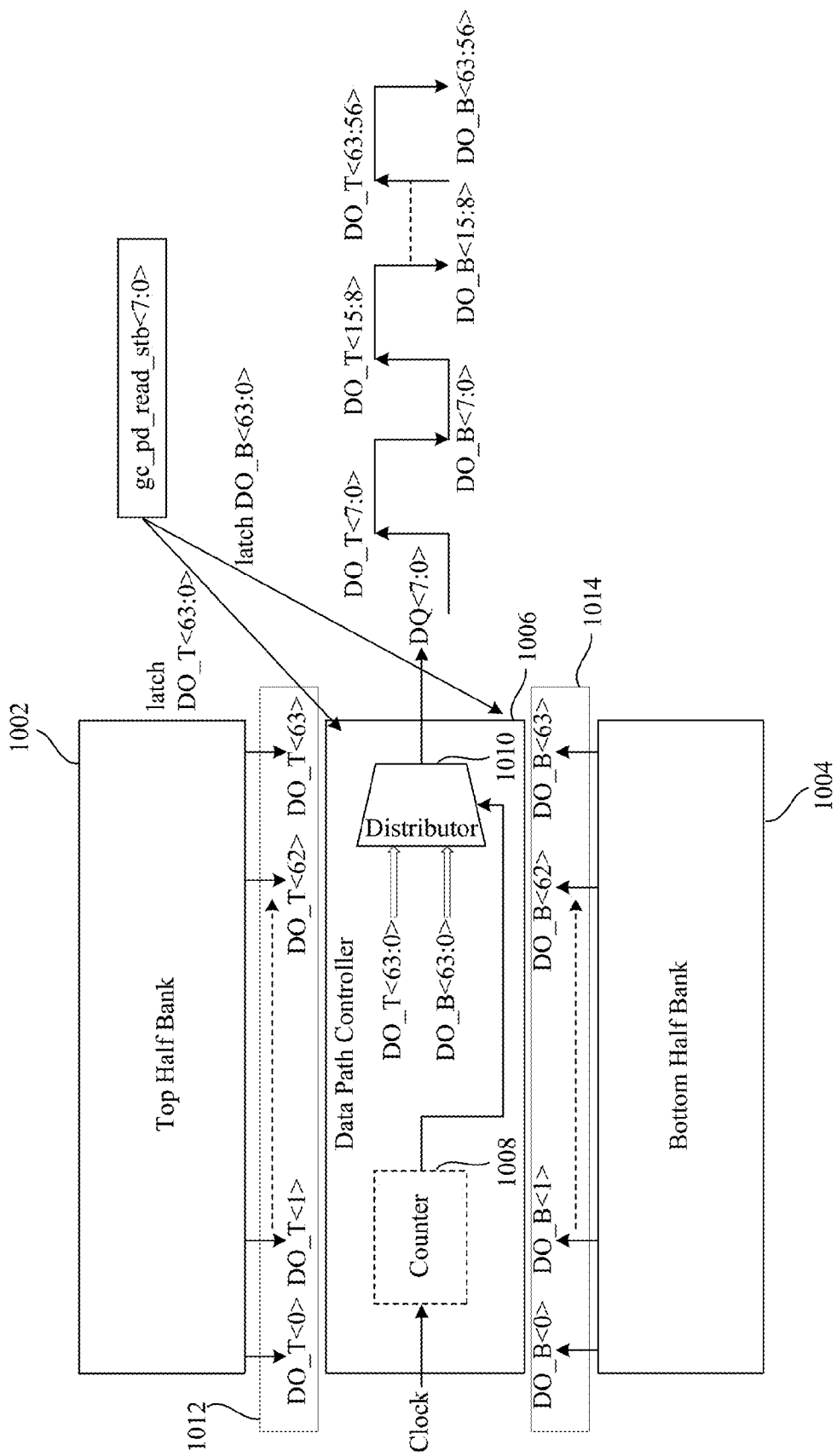
FIG. 10 is an illustration of a top half bank, a bottom half bank, a top half buffer, a bottom half buffer and a block diagram of the data path controller, as illustrated in FIG. 4 and a description of the signals controlled thereby, according to an embodiment of the present disclosure.

FIG. 10 is an illustration of a top half bank, a bottom half bank, a top half buffer, a bottom half buffer and a block diagram of the data path controller, as illustrated in FIG. 4 and a description of the signals controlled thereby, according to an embodiment of the present disclosure.

Referring to FIG. 10, a top half bank 1002 a bottom half bank 1004, a top half buffer 1012 (including one or more buffers), a bottom half buffer 1014 (including one or more buffers) and a data path controller 1006 are illustrated. During a read operation, the top half bank 1002 provides 64 bits of data DO_T<0> to DO_T<63> to the data path controller 1006 via the top half buffer 1012 and the bottom half bank 1004 provides 64 bits of data DO_B<0> to DO_<63> to the data path controller 1006 via the bottom half buffer 1014. The data path controller 1006 includes a counter 1008, which receives a clock signal, and includes a distributor 1010, which receives data DO_T<63:0> and data DO_B<63:0> from the top and bottom half banks 1002 and 1004 via the top and bottom buffers 1012 and 1014 (e.g. latches), respectively, and receives an output from the counter 1008.

Specifically, the distributor 1010 provides, as an output of the data path controller 1006, a DQ signal that is output at rising and falling edges of the CK signal, as illustrated in FIG. 6B. In an implementation, the distributor 1010 is comprised of multiple switches that are controlled by the counter 1008. As illustrated, an 8-bit DQ signal (e.g., a DQ<7:0> signal) is output at 8 rising edges and 8 falling edges of the CK signal.

In the first rising edge of the CK signal, the DQ<7:0> signal outputs 8 bits selected from DO_T<63:0> (e.g., DO_T<7:0>) and in the first falling edge of the CK signal, the DQ<7:0> signal outputs 8 bits selected from DO_B<63:0> (e.g., DO_B<7:0>).

In the second rising edge of the CK signal, the DQ<7:0> signal outputs 8 bits selected from DO_T<63:0> (e.g., DO_T<15:8>) and in the second falling edge of the CK signal, the DQ<7:0> signal outputs 8 bits selected from DO_B<63:0> (e.g., DO_B<15:8>), and so on, such that in the eighth rising edge of the CK signal, the DQ<7:0> signal outputs 8 bits from DO_T<63:0> (e.g., DO_T<63:56>) and in the eighth falling edge of the CK signal, the DQ<7:0> signal outputs 8 bits selected from DO_B<63:0> (e.g., DO_B<63:56>).

In an implementation, the data output from the distributor 1010 is received by the data port 446, as illustrated in FIG. 4, and is then output by the transmitters of the data port 446.

For a write operation, the procedure is similar to that explained above, except that the data flows in the opposite direction.

In an implementation, the counter 1008 is a timing circuit that controls the switches of the distributor 1010. Specifically, the counter 1008 provides a count for the rising edge and the falling edge of the CK signal, which controls the output of the DQ<7:0> signal and determines which of the 8 bits of the DO_T<63:0> and DO_T<63:0> signals are selected for output.

Further, a gc_pd_read_stb<7:0> signal, which is a strobe signal, strobes the data from the top half bank 1002 (DO_T<63:0>) and the data from the bottom half bank 1004 (DO_B<63:0>) to the data path controller 1006 by utilizing a latch DO_T<63:0> signal and a latch DO_B<63:0> signal.

Figure 11:
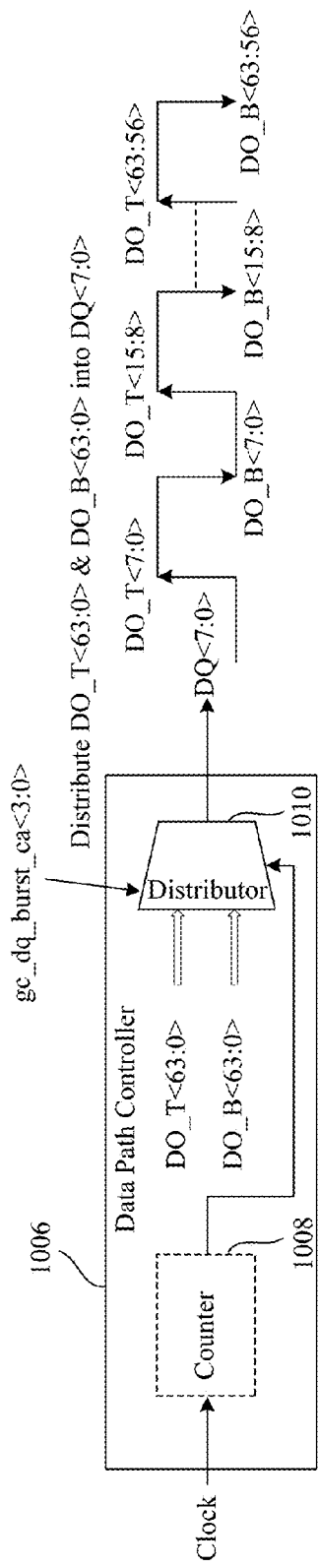
FIG. 11 provides an illustration of the data path controller 1006, as illustrated in FIG. 10 and provides a table describing various signals output from the distributor 1010 of the data path controller 1006 and a DQ source, according to an embodiment of the present disclosure.

FIG. 11 provides an illustration of the data path controller 1006, as illustrated in FIG. 10 and provides a table describing various signals output from the distributor 1010 of the data path controller 1006 and a DQ source, according to an embodiment of the present disclosure.

Referring to FIG. 11, and as discussed with reference to FIG. 10, for a read operation the distributor 1010 distributes the DO_T<63:0> data and the DO_B<63:0> data into the DQ<7:0> signal. As illustrated, the distributor 1010 receives a gc_dq_burst_sa<3:0> signal which controls the output thereof (e.g., gc_dq_burst_sa<3:0> controls DO_T<63:0> data and DO_B<63:0> data as output from the distributor 1010. Specifically, based on the gc_dq_burst_sa<3:0> signal the distributor 1010 selects specific data from the top and bottom half banks 1002 and 1004 to distribute via the DQ<7:0> signal. As illustrated in the table, when the gc_dq_burst_sa<3:0> signal provides values of "0," "0," "0" and "0," the DQ<7:0> signal outputs DO_T<7:0> on the rising edge of the CK signal and when the gc_dq_burst_sa<3:0> signal provides values of "0," "0," "0" and "1," the DQ<7:0> signal outputs DO_B<7:0> on the falling edge of the CK signal. Various combinations of the data included in the gc_dq_burst_sa<3:0> signal and the output of the DQ<7:0> signal are illustrated in the table. Each of these combinations are not explicitly explained here, but are clear based on the contents of the table.

For a write operation, the procedure is similar to that explained above, except that the data flows in the opposite direction.

Figure 12:
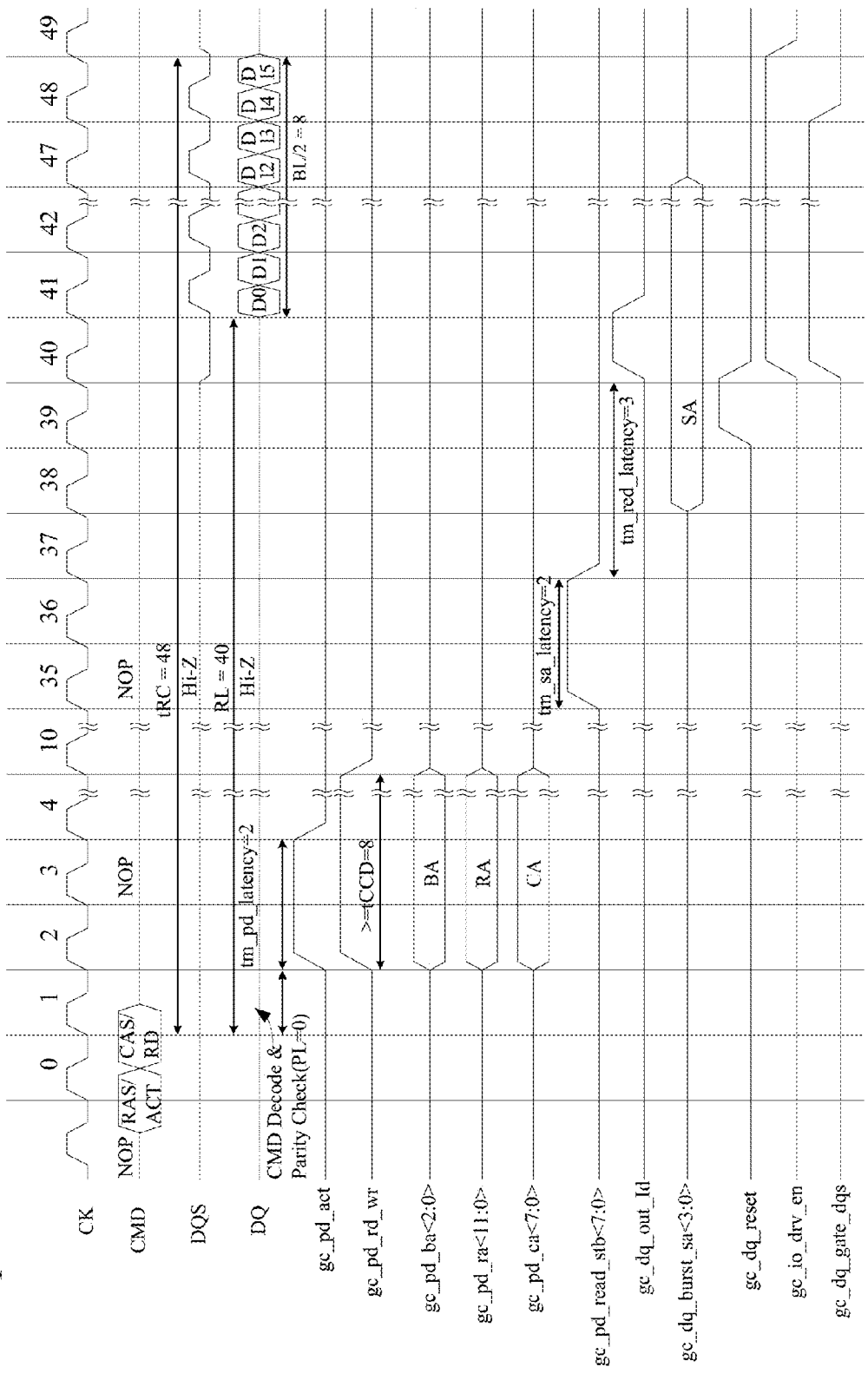
FIG. 12 illustrates a timing chart for reading data from a double-data-rate PCM, according to an embodiment of the present disclosure.

FIG. 12 illustrates a timing chart for reading data from a double-data-rate PCM, according to an embodiment of the present disclosure.

Referring to FIG. 12, a timing chart is provided to illustrate the CK, CMD, DQS and DQ signals, as, for example, discussed above with reference to FIGS. 6A and 6B. To avoid redundant descriptions and explanations of the CK, CMD, DQS and DQ signals, the detailed descriptions thereof are omitted. Detailed descriptions of these signals are provided in the description of FIGS. 6A and 6B.

Referring to FIG. 12, various timings of the following signals are also illustrated: gc_pd_act, which is signal for activating a predecoder; gc_pd_rd_wr, which is a signal for reading and writing; gc_pd_ba<2:0>, which is a signal for identifying a bank address; gc_pd_ra<11:0>, which is a signal for identifying a row address; gc_pd_ca<7:0>, which is a signal for identifying a column address; gc_pd_read_stb<7:0>, which is a strobe signal that strobes data from the top half bank 1002 (of FIG. 10) and data from the bottom half bank 1004 (of FIG. 10) to the data path controller 1006 (of FIG. 10); gc_dq_out_id, which is a signal for data out identification, gc_dq_burst_sa<3:0>, which is a signal for controlling DO_T<63:0> data and DO_B<63:0> data as output from the distributor 1010 (of FIG. 10), gc_dq_reset, which is a reset signal; gc_io_drv_en, which is a signal for enabling an input/output driver; and gc_dq_gate_dqs, which is a signal to gate a DQS.

As illustrated, the gc_pd_act signal transitions from low to high when RAS and CAS are active and parity check (PL) is 0. The gc_pd_act signal remains high for 2 clock cycles when tm_pd_latency equals 2.

The gc_pd_rd_wr signal transitions from low to high at a same timing as the gc_pd_act signal and remains high for 8 CK cycles when tCCD equals 8.

The gc_pd_ba<2:0> signal is triggered at the same timing as the gc_pd_act signal and provides a bank address for reading data.

The gc_pd_ra<11:0> signal is triggered at the same timing as the gc_pd_act signal and provides a row address for reading data.

The gc_pd_ca<7:0> signal is triggered at the same timing as the gc_pd_act signal and provides a column address for reading data.

The gc_pd_read_stb<7:0> signal transitions from low to high, in this implementation, at CK cycle 35 and remains high for 2 CK cycles when tm_sa_latency equals 2. As discussed above with reference to FIG. 10, gc_pd_read_stb<7:0> is a strobe signal, which strobes the data from the top half bank 1002 (DO_T<63:0>) and the data from the bottom half bank half 1004 (DO_B<63:0>) to the data path controller 1006 by utilizing a latch DO_T<63:0> signal and a latch DO_B<63:0>

The gc_dq_out_id signal transitions from low to high 3 CK cycles after the gc_pd_read_stb<7:0> signal transitions to low, when tm_red_latency equals 3. This signal remains high for one CK cycle, after which the DQ signal begins writing data D0 to D15.

The gc_dq_burst_sa<3:0> signal, as discussed above with reference to FIG. 11, controls the distributor 1010 to select specific data from the top and bottom half banks 1002 and 1004 to distribute via the DQ<7:0> signal.

The gc_dq_reset signal transitions from low to high at CK cycle 39, which is 1 CK cycle after the gc_dq_burst_sa<3:0> signal initiates in CK cycle 38. This signal lasts for 1 CK cycle.

The gc_io_drv_en signal transitions from low to high at the same time as the gc_dq_out_id signal and 1 CK cycle after the gc_dq_reset signal transitions from low to high. This signal transitions back to low after the data is read according to the DQ signal.

The gc_dq_gate_dqs signal transitions from low to high at the same time as the gc_dq_out_id signal and transitions back to low one CK cycle before the gc_io_dr_en signal.

Example Implementations of the Present Disclosure

Various technologies implemented as described with reference to some or all of FIGS. 1A-12 are provided below.

In an implementation, a memory is provided. The memory can be, at least partially, implemented as the block diagram 400 of FIG. 4, as well as the PCM array partition 800 of FIG. 8. The memory includes a data port, such as the data port 446 of FIG. 4, having a double-data-rate data channel including B transmitters, such as the transmitter 450 of FIG. 4, disposed in parallel, where B is an integer of one or more, the B transmitters transferring data on both rising and falling edges of a transmit clock, such as the CK signal illustrated in FIG. 10 and the output signal illustrated in FIGS. 10 and 11. The memory can also include a first memory array, such as the top array half 402 of FIG. 4, including a first array data bus, such as DOUT and/or DIN as illustrated in FIG. 4, including N lines on which N bits can be transferred in parallel, N being an integer of one or more. The memory may also include a second memory array, such as the bottom array half 404 of FIG. 4, including a second array data bus, such as DOUT and/or DIN as illustrated in FIG. 4, including N lines on which N bits can be transferred in parallel. Further, the memory can also include a data path controller, such as the data path controller 406 of FIG. 4 and the data path controller 1006 of FIGS. 10 and 11, including a timing circuit, such as the counter 1008 of FIGS. 10 and 11, and a data distributor, such as the distributor 1010 of FIGS. 10 and 11, controlled by an output of the timing circuit, the data distributor being disposed between the first memory array and the second memory array, such as the top and bottom array halves 402 and 404 of FIG. 4 and the top and bottom half banks 1002 and 1004 of FIGS. 10 and 11, and being connected to the data port. On the rising edge of the transmit clock, the data distributor distributes a first data segment, such as the DO_T<7:0> signal illustrated in FIGS. 10 and 11, comprised of B bits from the first array data bus to the data port for transfer, and on the falling edge of the transmit clock, the data distributor distributes a second data segment, such as the DO_B<7:0> signal illustrated in FIGS. 10 and 11, comprised of B bits from the second array data bus to the data port for transfer.

The data port may include output pads, such as the input/output pads (pins) 448 as illustrated in FIG. 4, connected to the transmitters and disposed between the first memory array and the second memory array.

In an implementation, the data path controller, the first array data bus and the second array data bus are configured such that (i) a maximum length of a wire routing for a data path from an address memory cell of the first memory array to the data distributor and a maximum length of a wire routing for a data path from an address memory cell of the second memory array to the data distributor are substantially equal, and (ii) a minimum length of a wire routing for a data path from an address memory cell of the first memory array to the data distributor and a minimum length of a wire routing for a data path from an address memory cell of the second memory array to the data distributor are substantially equal, as illustrated in FIG. 8 and described in the corresponding descriptions thereof.

In an implementation, the first memory array, the second memory array and the data path controller are disposed on a single integrated circuit chip and in another implementation, the first memory array, the second memory array and the data path controller are disposed on a multichip package.

In an implementation, the memory may include an address decoder, such as the pre-decoder 412 of FIG. 4, where the address decoder accesses N bits from the first memory array and N bits from the second memory array in response to a page address including address bits identified in a page read command to select a page of 2 N bits, as described with reference to FIG. 4. In an implementation, the address decoder is disposed between the first memory array and the second memory array, as illustrated in FIG. 4.

In an implementation, the first memory array and the second memory array include a complementary set of memory half-banks, such as half bank 0 of top array half 402 and bank 0 of bottom array half 404 of FIG. 4, such that (i) the first memory array includes a first half-bank (e.g., bank 0 of the top array half 402) of the complementary set of the memory half-banks and the second memory array includes a second half-bank (e.g., bank 0 of the bottom array half 402) of the complementary set of the memory half-banks, (ii) the first half-bank of the complementary set of memory half-banks is coupled to a set of B lines, such as DOUT and/or DIN of the top array half 402, of the first array data bus of the first memory array, (iii) the second half-bank of the complementary set of memory half-banks is coupled to a set of B lines, such as DOUT and/or DIN of the bottom array half 404, of the second array data bus of the second memory array, and (iv) the memory further includes an address decoder that, in response to a bank address, accesses B cells from the first half-bank of the first memory array and accesses B cells from the second half-bank of the second memory array, the bank address including address bits for selecting a bank of 2 B bits.

In an implementation, the timing circuit receives a clock signal, such as the clock signal of FIGS. 10 and 11, and generates a control signal that controls the data distributor to transmit the first data segment on the rising edge of the timing clock and controls the data distributor to transmit the second data segment on a subsequent falling edge of the timing clock, as illustrated in FIGS. 10 and 11.

Furthermore, in various implementations a memory, as described above, is provided for having data written thereto. The above-described implementations of the memory for having data read therefrom also perform the writing of the data using the same structure.

The above-described structures required and implemented by the memory can also be implemented according to methods of reading data from a memory and writing data to a memory.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
   a data port having a double-data-rate data channel including B transmitters disposed in parallel, where B is an integer of one or more, the B transmitters transferring data on both rising and falling edges of a transmit clock;
   a first memory array including a first array data bus including N lines on which N bits can be transferred in parallel, N being an integer of one or more;
   a second memory array including a second array data bus including N lines on which N bits can be transferred in parallel; and
   a data path controller including a timing circuit and a data distributor controlled by an output of the timing circuit, the data distributor being disposed between the first memory array and the second memory array and being connected to the data port, wherein:
      on the rising edge of the transmit clock, the data distributor distributes a first data segment comprised of B bits from the first array data bus to the data port for transfer; and
      on the falling edge of the transmit clock, the data distributor distributes a second data segment comprised of B bits from the second array data bus to the data port for transfer.

2. The memory of claim 1, wherein the data port includes output pads connected to the transmitters and disposed between the first memory array and the second memory array.

3. The memory of claim 1, wherein the data path controller, the first array data bus and the second array data bus are configured such that:
   a maximum length of a wire routing for a data path from an address memory cell of the first memory array to the data distributor and a maximum length of a wire routing for a data path from an address memory cell of the second memory array to the data distributor are substantially equal; and
   a minimum length of a wire routing for a data path from an address memory cell of the first memory array to the data distributor and a minimum length of a wire routing for a data path from an address memory cell of the second memory array to the data distributor are substantially equal.

4. The memory of claim 1, wherein the first memory array, the second memory array and the data path controller are disposed on a single integrated circuit chip.

5. The memory of claim 1, wherein the first memory array, the second memory array and the data path controller are disposed on a multichip package.

6. The memory of claim 1, wherein:
   the memory further comprises an address decoder; and
   the address decoder accesses N bits from the first memory array and N bits from the second memory array in response to a page address including address bits identified in a page read command to select a page of 2N bits.

7. The memory of claim 6, wherein at least part of the address decoder is disposed between the first memory array and the second memory array.

8. The memory of claim 1, wherein:
   the first memory array and the second memory array include a complementary set of memory half-banks, such that the first memory array includes a first half-bank of the complementary set of the memory half-banks and the second memory array includes a second half-bank of the complementary set of the memory half-banks;
   the first half-bank of the complementary set of memory half-banks is coupled to a set of B lines of the first array data bus of the first memory array;
   the second half-bank of the complementary set of memory half-banks is coupled to a set of B lines of the second array data bus of the second memory array; and
   the memory further includes an address decoder that, in response to a bank address, accesses B cells from the first half-bank of the first memory array and accesses B cells from the second half-bank of the second memory array, the bank address including address bits for selecting a bank of 2B bits.

9. The memory of claim 1, wherein the timing circuit receives a clock signal and generates a control signal that controls the data distributor to transmit the first data segment on the rising edge of the transmit clock and controls the data distributor to transmit the second data segment on a subsequent falling edge of the transmit clock.

10. The memory of claim 1,
    the data port including B receivers disposed in parallel, the B receivers transferring data on both rising and falling edges of a receiver clock; and on the rising edge of the receiver clock, the data distributor distributes a first data segment comprised of B bits from the data port to the first array data bus for a data write; and on the falling edge of the receiver clock, the data distributor distributes a second data segment comprised of B bits from the data port to the second array data bus for a data write.

11. The memory of claim 10, wherein the data port includes input pads connected to the receivers and disposed between the first memory array and the second memory array.

12. The memory of claim 10, wherein the data path controller, the first array data bus and the second array data bus are configured such that:

a maximum length of a wire routing for a data path from an address memory cell of the first memory array to the data distributor and a maximum length of a wire routing for a data path from an address memory cell of the second memory array to the data distributor are substantially equal; and a minimum length of a wire routing for a data path from an address memory cell of the first memory array to the data distributor and a minimum length of a wire routing for a data path from an address memory cell of the second memory array to the data distributor are substantially equal.

13. The memory of claim 10, wherein the first memory array, the second memory array and the data path controller are disposed on a single integrated circuit chip.

14. The memory of claim 10, wherein the first memory array, the second memory array and the data path controller are disposed on a multichip package.

15. The memory of claim 10, wherein:

the memory further comprises an address decoder; and the address decoder accesses memory cells storing N bits from the first memory array and memory cells storing N bits from the second memory array in response to a page address including address bits identified in a page write command to select a page of 2N bits.

16. The memory of claim 15, wherein at least part of the address decoder is disposed between the first memory array and the second memory array.

17. The memory of claim 10, wherein:

the first memory array and the second memory array include a complementary set of memory half-banks, such that the first memory array includes a first half-bank of the complementary set of the memory half-banks and the second memory array includes a second half-bank of the complementary set of the memory half-banks;

the first half-bank of the complementary set of memory half-banks is coupled to a set of B lines of the first array data bus of the first memory array;

the second half-bank of the complementary set of memory half-banks is coupled to a set of B lines of the second array data bus of the second memory array; and the memory further includes an address decoder that, in response to a bank address, accesses B cells from the first half-bank of the first memory array and accesses B cells from the second half-bank of the second memory array, the bank address including address bits for selecting a bank of 2B bits.

18. The memory of claim 10, wherein the timing circuit receives a clock signal and generates a control signal that controls the data distributor to transmit the first data segment to the first array data bus on the rising edge of the receiver clock and controls the data distributor to transmit the second data segment to the second array data bus on a subsequent falling edge of the receiver clock.

19. A method of reading data from a memory, wherein the memory includes:

a data port having a double-data-rate data channel including B transmitters disposed in parallel, where B is an integer of one or more, the B transmitters for transferring data on both rising and falling edges of a transmit clock;

a first memory array including a first array data bus including N lines on which N bits can be transferred in parallel, N being an integer of one or more;

a second memory array including a second array data bus including N lines on which N bits can be transferred in parallel; and a data path controller including a timing circuit and a data distributor controlled by an output of the timing circuit, the data distributor being disposed between the first memory array and the second memory array and being connected to the data port, and wherein the method comprises:

distributing, by the data distributor and on the rising edge of the transmit clock, a first data segment comprised of B bits from the first array data bus to the data port for transfer; and distributing, by the data distributor and on the falling edge of the transmit clock, a second data segment comprised of B bits from the second array data bus to the data port for transfer.

* * * * *